(12) United States Patent
Satoh

(10) Patent No.: US 8,673,778 B2
(45) Date of Patent: Mar. 18, 2014

(54) TUNGSTEN FILM FORMING METHOD

(71) Applicant: Tokyo Electron Limited, Tokyo (JP)

(72) Inventor: Kohichi Satoh, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/684,389

(22) Filed: Nov. 23, 2012

(65) Prior Publication Data

US 2013/0137262 A1     May 30, 2013

(30) Foreign Application Priority Data

Nov. 25, 2011 (JP) .................................. 2011-258117
Mar. 7, 2012 (JP) .................................. 2012-051018
Aug. 23, 2012 (JP) .................................. 2012-183934

(51) Int. Cl.
*H01L 21/302* (2006.01)

(52) U.S. Cl.
USPC ........... 438/685; 438/649; 438/653; 438/667; 438/694; 438/696; 257/E21.585

(58) Field of Classification Search
None
See application file for complete search history.

(56) References Cited

U.S. PATENT DOCUMENTS 5,306,666 A * 4/1994 Izumi ........................... 438/680
2005/0032364 A1   2/2005 Okubo et al.

FOREIGN PATENT DOCUMENTS

| JP | 2003-193233 | 7/2003 |
| JP | 2004-273764 | 9/2004 |
| JP | 2005-518088 | 6/2005 |
| KR | 10-0830590 | 5/2008 |
| KR | 10-2011-0227607 | 3/2011 |

* cited by examiner

*Primary Examiner* — Kyoung Lee
(74) *Attorney, Agent, or Firm* — Oblon, Spivak, McClelland, Maier & Neustadt, L.L.P.

(57) ABSTRACT

A tungsten film forming method for forming a tungsten film on a surface of a substrate while heating the substrate in a depressurized atmosphere in a processing chamber includes forming an initial tungsten film for tungsten nucleation on the surface of the substrate by alternately repeating a supply of $WF_6$ gas which is raw material of tungsten and a supply of $H_2$ gas which is a reducing gas in the processing chamber while performing a purge in the processing chamber between the supplies of the $WF_6$ gas and the $H_2$ gas and adsorbing a gas containing a material for nucleation onto a surface of the initial tungsten film. The film forming method further includes depositing a crystallinity blocking tungsten film for blocking crystallinity of the initial tungsten film by supplying the $WF_6$ gas and the $H_2$ gas into the processing chamber.

43 Claims, 21 Drawing Sheets

INITIATION PROCESS

DEPOSITION OF INITIAL
TUNGSTEN FILM

ADSORPTION PROCESS

DEPOSITION OF CRYSTALLINITY
BLOCKING TUNGSTEN FILM

DEPOSITION OF MAIN
TUNGSTEN FILM

TUNGSTEN FILM FORMING METHOD

CROSS-REFERENCE TO RELATED APPLICATION

This application claims priority to Japanese Patent Application Nos. 2011-258117, 2012-051018, and 2012-183934 filed on Nov. 25, 2011, Mar. 7, 2012, and Aug. 23, 2012, respectively, the entire contents of which are incorporated herein by reference.

FIELD OF THE INVENTION

The present invention relates to a tungsten film forming method for forming a tungsten film on a substrate.

BACKGROUND OF THE INVENTION

In a process of manufacturing a semiconductor device, a tungsten (W) film is used to fill up recesses (via holes) between wirings or recesses (contact holes) for substrate contact.

As a film forming method of the tungsten (W) film, physical vapor deposition (PVD) has been used in the past. However, since tungsten is metal with a high melting point and it is difficult to cope with high coverage due to the recent miniaturization of devices in the PVD, chemical vapor deposition (CVD) which can sufficiently cope with high coverage and miniaturization of devices is being mainly used.

When filling the W film in the via holes or contact holes by CVD, from the viewpoint of reaction suppression or the adhesion with a silicon layer, a TiN film is formed as a barrier layer on the silicon layer, and the tungsten film is deposited thereon.

During deposition of the tungsten film, the deposition is mainly performed by the reaction of $WF_6 + 3H_2 \rightarrow W + 6HF$ using tungsten hexafluoride ($WF_6$) as a raw material of tungsten, and a $H_2$ gas as a reducing gas. However, in the first nucleation, a $SiH_4$ gas or $B_2H_6$ gas having a reducing power greater than $H_2$ gas is used as a reducing gas (see, e.g., Japanese Patent Application Publication Nos. 2003-193233 and 2004-273764).

However, since silicon (Si) atoms or boron (B) atoms are incorporated into the tungsten film in the case of performing the nucleation of tungsten by using $SiH_4$ gas or $B_2H_6$ gas as a reducing gas, the resistance is high compared to a pure tungsten film. Due to the recent miniaturization of contact holes, the W film having a lower resistance is required, and the nucleation using $SiH_4$ gas or $B_2H_6$ gas no longer meets the requirements. Further, in the case of using $B_2H_6$ gas as a reducing gas, it is possible to lower the resistance than when using $SiH_4$ gas, but electrical characteristics may be deteriorated or the adhesion with the underlying film may be deteriorated due to diffusion of B.

SUMMARY OF THE INVENTION

In view of the above, the present invention provides a tungsten film forming method capable of forming a low-resistance tungsten film without deteriorating adhesion with an underlying film or electrical characteristics.

In accordance with one aspect of the present invention, there is provided a tungsten film forming method for forming a tungsten film on a surface of a substrate while heating the substrate in a depressurized atmosphere in a processing chamber, the method including: forming an initial tungsten film for tungsten nucleation on the surface of the substrate by alternately repeating a supply of $WF_6$ gas which is raw material of tungsten and a supply of $H_2$ gas which is a reducing gas in the processing chamber while performing a purge in the processing chamber between the supplies of the $WF_6$ gas and the $H_2$ gas; adsorbing a gas containing a material for nucleation onto a surface of the initial tungsten film; depositing a crystallinity blocking tungsten film for blocking crystallinity of the initial tungsten film by supplying the $WF_6$ gas and the $H_2$ gas into the processing chamber; and after stopping the supply of the $WF_6$ gas and increasing a pressure in the processing chamber after completion of deposition of the crystallinity blocking tungsten film, depositing a main tungsten film by supplying the $WF_6$ gas and the $H_2$ gas at a pressure higher than that during deposition of the crystallinity blocking tungsten film while setting a flow rate of the $WF_6$ gas to be higher than that during deposition of the crystallinity blocking tungsten film.

In accordance with another aspect of the present invention, there is provided a tungsten film forming method for forming a tungsten film on a surface of a substrate while heating the substrate in a depressurized atmosphere in a processing chamber, the method including: forming an initial tungsten film for tungsten nucleation on the surface of the substrate by alternately repeating a supply of $WF_6$ gas which is raw material of tungsten and a supply of $H_2$ gas which is a reducing gas in the processing chamber while performing a purge in the processing chamber between the supplies of the $WF_6$ gas and the $H_2$ gas; depositing a crystallinity blocking tungsten film for blocking crystallinity of the initial tungsten film by supplying the $WF_6$ gas and the $H_2$ gas into the processing chamber; and after stopping the supply of the $WF_6$ gas and increasing a pressure in the processing chamber after completion of deposition of the crystallinity blocking tungsten film, depositing a main tungsten film by supplying the $WF_6$ gas and the $H_2$ gas at a pressure higher than that during deposition of the crystallinity blocking tungsten film while setting a flow rate of the $WF_6$ gas to be higher than that during deposition of the crystallinity blocking tungsten film.

In accordance with still another aspect of the present invention, there is provided a tungsten film forming method for forming a tungsten film on a surface of a substrate while heating the substrate in a depressurized atmosphere in a processing chamber, the method including: forming an initial tungsten film for tungsten nucleation on the surface of the substrate by alternately repeating a supply of $WF_6$ gas which is raw material of tungsten and a supply of $H_2$ gas which is a reducing gas in the processing chamber while performing a purge in the processing chamber between the supplies of the $WF_6$ gas and the $H_2$ gas; adsorbing a gas containing a material for nucleation onto a surface of the initial tungsten film; and depositing a main tungsten film onto the substrate on which the gas containing the material for nucleation is adsorbed by supplying the $WF_6$ gas and the $H_2$ gas in the processing chamber.

Preferably, a time until deposition of the main tungsten film after completion of deposition of the crystallinity blocking tungsten film may be set to 20 to 270 seconds. Further, the crystallinity blocking tungsten film may have a thickness of 0.5 to 11.5 nm. Furthermore, deposition of the crystallinity blocking tungsten film may be performed while the pressure in the processing chamber is set to 100 to 26667 Pa, the flow rate of the $WF_6$ gas is set to 5 to 200 sccm (mL/min), and a flow rate of the $H_2$ gas is set to 100 to 12000 sccm (mL/min).

Preferably, the adsorption of the gas may be performed by supplying $SiH_4$ gas serving as a silicon compound gas and the $H_2$ gas. Further, adsorption of the gas may be performed for 10 seconds or more.

Preferably, deposition of the main tungsten film may be performed while the pressure in the processing chamber is set to 2666 to 26667 Pa, the flow rate of the $WF_6$ gas is set to 150 to 700 sccm (mL/min), and a flow rate of the $H_2$ gas is set to 1000 to 12000 sccm (mL/min). Further, the main tungsten film may have a thickness of 25 nm or more.

Preferably, after deposition of the main tungsten film, the substrate may be annealed. Further, the annealing may be performed at a temperature of 700° C. or more. Furthermore, the main tungsten film may have a thickness of 10 to 25 nm.

Preferably, if the main tungsten film has a thickness of 10 to 25 nm, the crystallinity blocking tungsten film may have a thickness of 3 nm or less. Further, the crystallinity blocking tungsten film may have a thickness of 1.5 nm or less. Deposition of the initial tungsten film may be performed for 4 to 20 seconds per cycle while the pressure in the processing chamber is set to 100 to 8000 Pa, the flow rate of the $WF_6$ gas is set to 50 to 500 sccm (mL/min), and a flow rate of the $H_2$ gas is set to 500 to 12000 sccm (mL/min), and the initial tungsten film has a thickness of 0.5 to 3.0 nm. Further, deposition of the initial tungsten film may be performed by performing vacuum evacuation while stopping the supply of a purge gas during the purge.

Preferably, the tungsten film forming method may further include: performing an initiation process to form nuclei on the surface of the substrate prior to deposition of the initial tungsten film. Further, the initiation process may be performed by supplying $SiH_4$ gas.

Preferably, a temperature of a mounting table for supporting the substrate may be 350 to 500° C. Further, a TiN film may be formed on the surface of the substrate.

In accordance with still another aspect of the present invention, there is provided a computer-readable storage medium storing a program which runs on a computer and, when executed, controls a film forming apparatus to perform the tungsten film filming method above described aspects of the present invention.

In accordance with the present invention, the deposition of the initial tungsten film is performed by ALD using the $H_2$ gas as a reducing gas, and after the adsorption process using a gas containing a material to be formed as nuclei and/or the deposition of the crystallinity blocking tungsten film, the deposition of the main tungsten film is performed. Accordingly, it is possible to obtain the tungsten film having few impurities and large crystal grains without taking over the underlying film, and the tungsten film having a resistivity lower than that in the conventional case can be formed. Further, since a gas containing B is not used during the deposition, deterioration of electrical characteristics or deterioration of the adhesion with the underlying film due to diffusion of B does not occur.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, an embodiment of the present invention will be described in detail with reference to the accompanying drawings which form a part hereof.

<Film Forming Apparatus>

Figure 1:
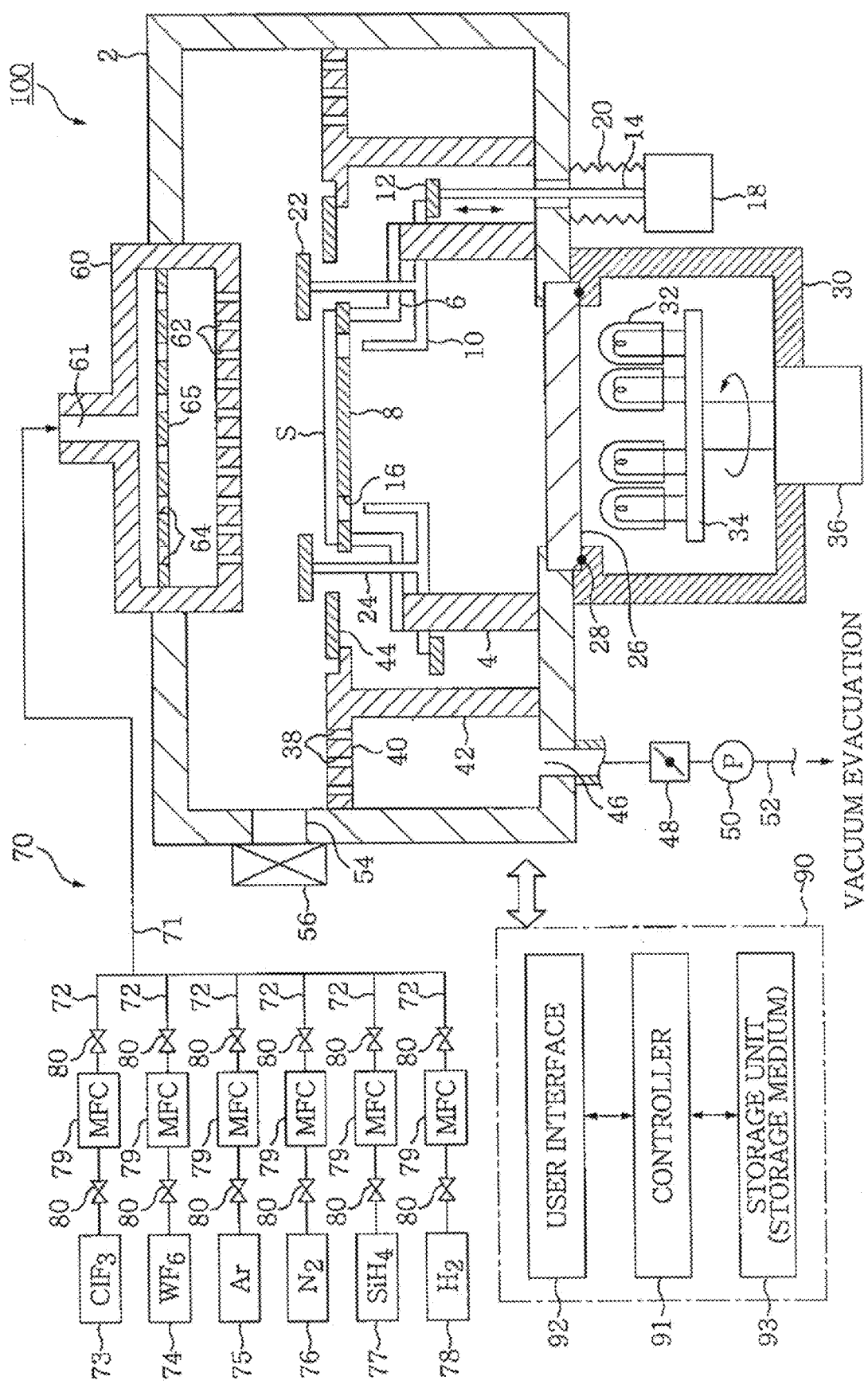
FIG. 1 is a cross-sectional view showing an example of a film forming apparatus for performing a tungsten film forming method according to the present invention.

FIG. 1 is a cross-sectional view showing an example of a film forming apparatus for performing a tungsten film forming method in accordance with the present invention.

As shown in FIG. 1, a film forming apparatus 100 has a cylindrical or box-shaped processing chamber 2 made of, e.g., aluminum or aluminum alloy. In the processing chamber 2, a mounting table 8 for mounting a semiconductor wafer (hereinafter simply referred to as a wafer) S that is a substrate to be processed is provided on pillars 4 standing from the bottom of the container through holding members 6 having an L-shaped cross section. The pillars 4 and the holding members 6 are formed of a heat ray transmissive material, e.g., quartz. The mounting table 8 is formed of, e.g., a carbon material or aluminum compound having a thickness of about 1 mm.

A plurality of, e.g., three, lifter pins 10 (only two shown) are provided below the mounting table 8. The base end portion of each of the lifter pins 10 is supported by an arc-shaped support member 12. A push-up rod 14 provided through the bottom of the container is attached to the support member 12, and the push-up rod 14 is configured to be moved up and down by an actuator 18. By vertically moving the push-up rod 14 by the actuator 18, the lifter pins 10 are vertically moved via the support member 12, and the lifter pins 10 are inserted through pin holes 16 provided through the mounting table 8 to lift the wafer S. At the lower portion of the push-up rod 14 extending through the bottom of the container, a stretchable bellows 20 is provided to hold an airtight state in the processing chamber 2.

At the periphery of the mounting table 8, a ring-shaped clamp ring 22 made of ceramic is provided to hold the peripheral portion of the wafer S such that the wafer S is fixed to the mounting table 8. The clamp ring 22 is connected to the lifter pins 10 through support rods 24 so that the clamp ring 22 is elevated integrally with the lifter pins 10. The lifter pins 10 and the support rods 24 are also formed of a heat ray transmissive material such as quartz.

At the bottom of the container directly below the mounting table 8, a transmission window 26 made of a heat ray transmissive material such as quartz is provided hermetically via a seal member 28 such as an O-ring. Below the transmission window 26, a box-shaped heating chamber 30 is provided so as to surround the transmission window 26. In the heating chamber 30, a plurality of heating lamps 32 also serving as a reflection mirror are mounted as a heating means on a turntable 34, and the turntable 34 is rotated by a rotation motor 36. Therefore, heat rays emitted from the heating lamps 32 are transmitted through the transmission window 26 and irradiated onto the lower surface of the mounting table 8 to heat the mounting table 8. Further, a resistance heater embedded in the mounting table 8 may be used as a heating means instead of the heating lamps 32.

At the outer peripheral side of the mounting table 8, a ring-shaped rectifier plate 40 having a number of rectification holes 38 is provided to be supported by a support column 42 formed annularly in the vertical direction. At the inner peripheral side of the rectifier plate 40, a ring-shaped attachment 44 made of quartz is provided to be in contact with the outer peripheral portion of the clamp ring 22 to prevent a gas from flowing downward therethrough.

An exhaust port 46 is provided at the bottom below the rectifier plate 40, and an exhaust pipe 52 is connected to the exhaust port 46. A pressure regulating valve 48 and a vacuum pump 50 are provided in the middle of the exhaust pipe 52. The processing chamber 2 is vacuum evacuated by the vacuum pump 50 to maintain a predetermined pressure therein. An opening 54 for loading/unloading the wafer S into/from the processing chamber 2 is provided at the sidewall of the processing chamber 2. The opening 54 is configured to be opened and closed by a gate valve 56.

Meanwhile, at the ceiling portion of the processing chamber 2, a shower head 60 is provided as a gas introducing means for introducing a predetermined gas therein. The shower head 60 is formed in a circular box shape using, e.g., aluminum alloy, and a gas inlet 61 is provided in the ceiling portion thereof. A plurality of gas discharge holes for discharging the gas supplied to the inside of the shower head 60 from the gas inlet 61 are uniformly formed on the lower surface of the shower head 60 to uniformly discharge the gas in a processing space above the wafer S. At the inside of the shower head 60, a diffusion plate 65 having a number of gas distribution holes 64 is disposed to diffuse the gas introduced into the shower head 60 such that the gas is supplied more uniformly to the wafer surface.

A gas pipe 71 of a gas supply unit 70 is connected to the gas inlet 61. The gas supply unit 70 includes the gas pipe 71 and a plurality of branch pipes 72 branched from the gas pipe 71. The gas supply unit 70 further includes a $ClF_3$ gas source 73, a $WF_6$ gas source 74, an Ar gas source 75, a $N_2$ gas source 76, a $SiH_4$ gas source 77, and a $H_2$ gas source 78. A $ClF_3$ gas used for cleaning is supplied from the $ClF_3$ gas source 73. Further, a $WF_6$ gas, which is a raw material of tungsten, is supplied from the $WF_6$ gas source 74. An Ar gas and $N_2$ gas to be used as a purge gas or diluent gas are supplied from the Ar gas source 75 and the $N_2$ gas source 76. Other inert gases may be also used as a purge gas or diluent gas. A $SiH_4$ gas to be used in an initiation process and Si adsorption process is supplied from the $SiH_4$ gas source 77. Further, a $H_2$ gas is supplied as a reducing gas of $WF_6$ from the $H_2$ gas source 78.

A flow controller 79 such as a mass flow controller and valves 80 located at the upstream and downstream sides of the flow controller 79 are provided in each of the branch pipes connected to these gas sources. Although not shown, a back gas Ar line is also provided to supply an Ar gas as a back gas (purge gas) in a space below the mounting table 8.

The film forming apparatus 100 includes a control unit 90 for controlling respective components of the film forming apparatus 100, e.g., the actuator 18, a power supply of the heating lamps 32, the vacuum pump 50, the mass flow controllers 79, the valves 80 and the like. The control unit 90 includes a controller 91 having a microprocessor (computer) to perform the control of each component, a user interface 92 having a keyboard for allowing an operator to perform an input operation of commands in order to manage the film forming apparatus 100, a display for visually displaying an operational status of the film forming apparatus 100 or the like, and a storage unit 93 which stores a process recipe, i.e., a control program for implementing the processing in the film forming apparatus 100 under the control of the controller 91, or a program for performing the processing in each component of the film forming apparatus 100 according to the processing conditions and various kinds of data. Further, the user interface 92 and the storage unit 93 are connected to the controller 91.

The above process recipe is stored in a storage medium in the storage unit 93. The storage medium may be a hard disk or a portable storage medium such as a CD-ROM, a DVD, and a flash memory. Further, the recipe may be transmitted properly from other devices via, e.g., a dedicated line.

Further, if necessary, a certain recipe is retrieved from the storage unit 93 in accordance with instructions from the user interface 92 and executed by the controller 91. Accordingly, a desired process is performed in the film forming apparatus 100 under the control of the controller 91.

<Film Forming Method>

Next, an embodiment of the film forming method performed using the film forming apparatus 100 configured as described above will be described.

First Embodiment

First Example

Figure 2:
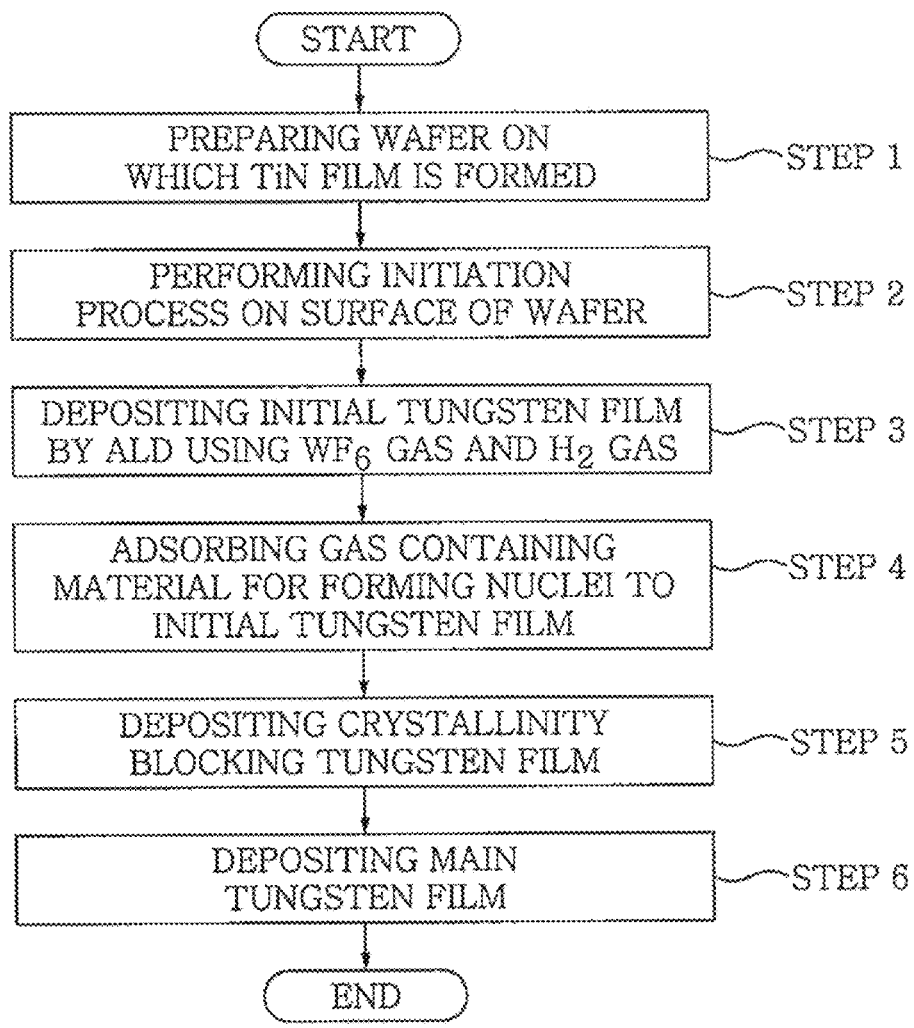
FIG. 2 is a flowchart of a film forming method in accordance with a first example of a first embodiment of the present invention.

FIG. 2 is a flowchart of a film forming method in accordance with a first example of a first embodiment of the present invention. FIGS. 3A to 3F are cross-sectional views showing each process step.

Figure 3A:
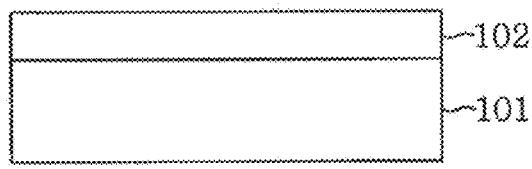
FIGS. 3A to 3F are cross-sectional views showing each step of the film forming method in accordance with the first example of the first embodiment of the present invention.

First of all, the wafer S in which a TiN film 102 is formed as a barrier layer of the surface on an interlayer insulating film 101 made of, e.g., $SiO_2$ as shown in FIG. 3A is prepared and loaded into the processing chamber 2 (step 1). Further, holes (contact holes or via holes) have been formed actually in the interlayer insulating film 101, but the holes are omitted in FIGS. 3A to 3F for simplicity.

Figure 3B:
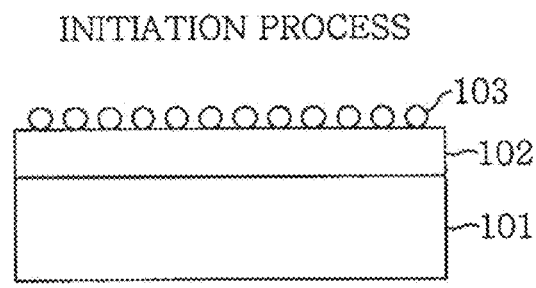

Then, a predetermined depressurized atmosphere is formed in the processing chamber 2, and while heating the wafer S through the mounting table 8 by the heating lamps 32 such that the temperature of the mounting table is 350 to 500° C., e.g., 410° C., a silane ($SiH_4$) gas and a $H_2$ gas or the like are introduced into the processing chamber 2, so that an initiation process is performed to form nuclei of Si on the surface of the wafer S prior to formation of nuclei of tungsten (step 2). The initiation process is a process for forming nuclei 103 of Si or the like on the entire surface of the underlying TiN film 102, as shown in FIG. 3B, to uniformly perform the formation of nuclei of W. In this case, the nuclei of Si are formed by adsorbing $SiH_4$. Actually, $SiH_4$ is thermally decomposed and adsorbed as $SiH_x$ (x<4).

Preferable ranges of conditions for this initiation process are as follows:
Temperature: 350 to 500° C. (temperature of the mounting table)
Pressure in the process container: 2666 to 20000 Pa
$SiH_4$ flow rate: 300 to 800 sccm (mL/min)
$H_2$ flow rate: 100 to 1000 sccm (mL/min)
Time: 5 to 120 sec The gas used in the initiation process is not limited to the $SiH_4$ gas, and $Si_2H_6$, $SiH_2Cl_2$, $B_2H_6$, $H_2$, $PH_3$ or the like may be used. In the case of using $B_2H_6$, $H_2$, and $PH_3$, B, P and H are formed as nuclei respectively. However, it is preferable that the nuclei of Si are formed using $SiH_4$, $Si_2H_6$, $SiH_2Cl_2$, or the like. Further, the initiation process is not necessarily required.

Figure 3C:
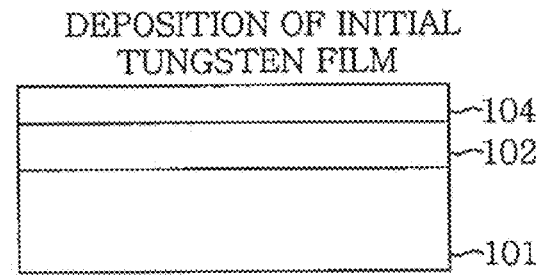
Figure 3D:
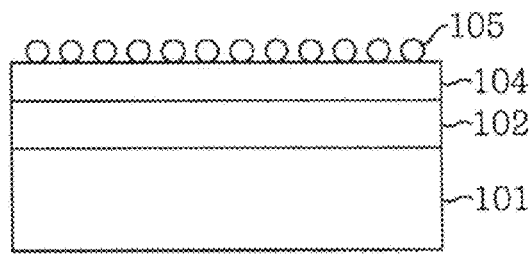
Figure 3E:
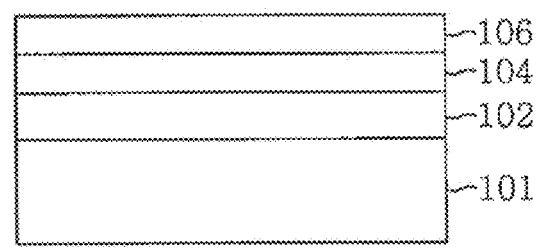
Figure 3F:
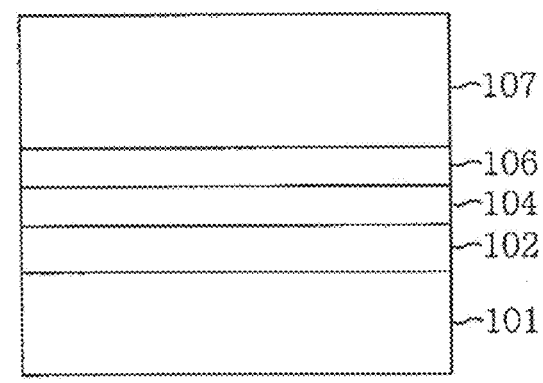
Figure 4:
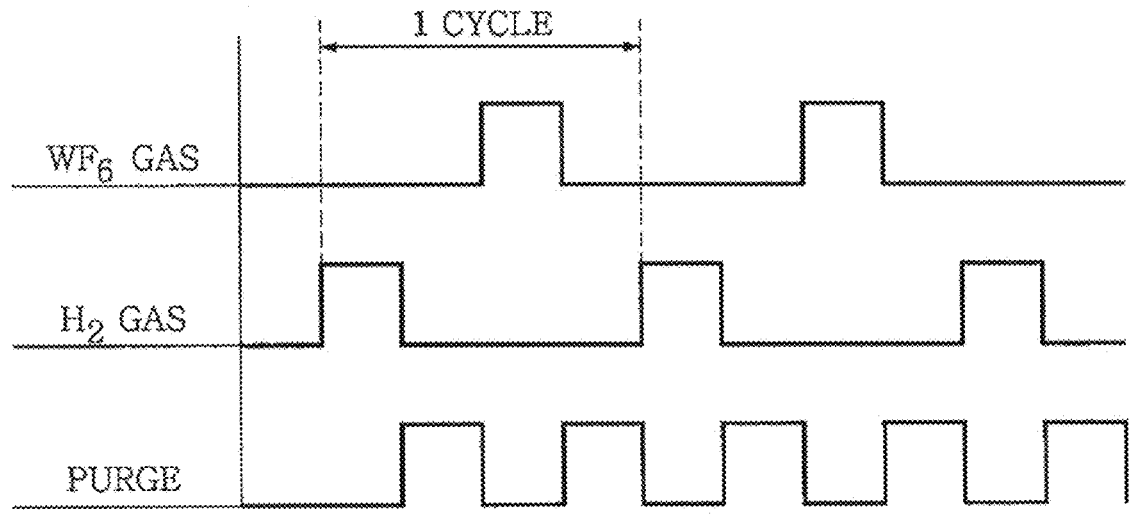
FIG. 4 is a timing chart showing the timing of gas introduction of during deposition of an initial tungsten film.

Then, while maintaining the heating temperature of the mounting table 8, the deposition of an initial tungsten film 104 for nucleation of tungsten is performed (step 3, FIG. 3C). The deposition of the initial tungsten film is performed by sequential flow deposition (SFD) or atomic layer deposition (ALD) in which the supply of $WF_6$ gas that is a raw material gas of tungsten and the supply of $H_2$ gas that is a reducing gas are repeated several times while performing a purge step between them as shown in FIG. 4. In the period of deposition of the initial tungsten film, a predetermined amount of either or both of the Ar gas and the $N_2$ gas may be allowed to flow. In this case, in the purge step, the supply of $WF_6$ gas and $H_2$ gas is stopped, and the Ar gas and/or $N_2$ gas functions as a purge gas. In the purge step, only vacuum evacuation may be performed without flowing the purge gas. Further, a protrusion representing the purge step in FIG. 4 merely shows that the purge step is performed, and does not represent on/off of the gas. That is, as described above, when the Ar gas and/or $N_2$ gas functions as a purge gas, it indicates that these gases are allowed to flow during the process. In the case of only vacuum evacuation, it indicates that there is the purge step without flowing the gas.

As described above, by using a hydrogen gas ($H_2$ gas) as a reducing gas and using the method of ALD or SFD, as in the case of using $SiH_4$ or $B_2H_6$ as a reducing gas, it is possible to reduce the amount of fluorine (F) remaining in the film without having silicon (Si) or boron (B) incorporated into the film. Accordingly, it is possible to form the initial tungsten film with less impurities and good quality. Further, the order of introduction of gases does not matter, but it is preferable to flow the $H_2$ gas serving as a reducing gas at the beginning.

Preferable ranges of conditions for deposition of the initial tungsten film are as follows:
Temperature: 350 to 500° C. (temperature of the mounting table)
Pressure: 100 to 8000 Pa
Time per cycle: 4 to 20 sec
The number of repetition times: 3 to 100
$WF_6$ flow rate: 50 to 500 sccm (mL/min)
$H_2$ flow rate: 500 to 12000 sccm (mL/min)
Ar flow rate: 3000 to 14000 sccm (mL/min)
$N_2$ flow rate: 0 to 4000 sccm (mL/min)
Film thickness: 0.5 to 3.0 nm After deposition of the initial tungsten film, while maintaining the temperature of the mounting table 8, a gas containing a material for forming nuclei is adsorbed to the surface of the initial tungsten film 104, and an adsorption process is performed to form nuclei 105 (step 4, FIG. 3D). Also, a crystallinity blocking tungsten film 106 for blocking the crystallinity of the initial tungsten film is deposited at the same temperature (step 5, FIG. 3E). Thereafter, the deposition of a main tungsten film 107 is performed at the same temperature (step 6, FIG. 3F).

The adsorption process in step 4 and the deposition of the crystallinity blocking tungsten film in step 5 are the processing performed in order to prevent the main tungsten film from taking over the crystallinity of the initial tungsten film.

Figure 5:
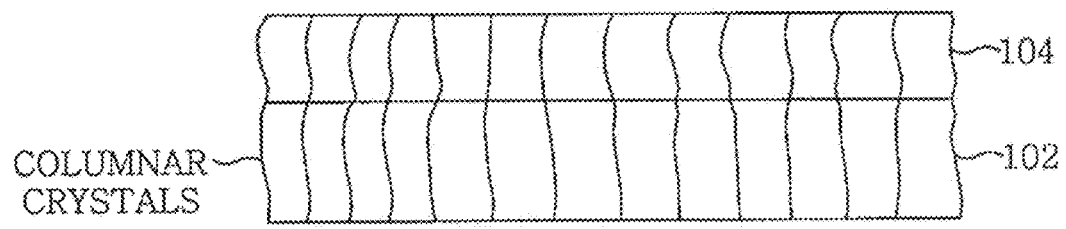
FIG. 5 is a schematic diagram showing crystallinity of the underlying TiN film and the initial tungsten film formed thereon.

As shown in FIG. 5, since crystals of the underlying TiN film 102 are columnar crystals, the initial tungsten film 104 is affected by the crystallinity of the TiN film and has columnar crystals. When the main tungsten film 107 is formed on the initial tungsten film 104 in this state, the main tungsten film 107 is also affected by the initial tungsten film 104 and has columnar crystals. In the columnar crystals, the grain boundaries are present in the vertical direction, and the resistance of the film becomes higher due to the presence of grain boundaries. Therefore, even if a film with few impurities is formed as the initial tungsten film, the resistance of the tungsten film formed finally becomes high.

Accordingly, in this embodiment, by performing the adsorption process in step 4 and the deposition of the crystallinity blocking tungsten film in step 5, the main tungsten film can be deposited in a state where it does not take over the crystallinity of the initial tungsten film, and the crystals of the main tungsten film can be grown to be sufficiently large. Thus, the tungsten film can be formed to have a very low resistance.

Figure 6:
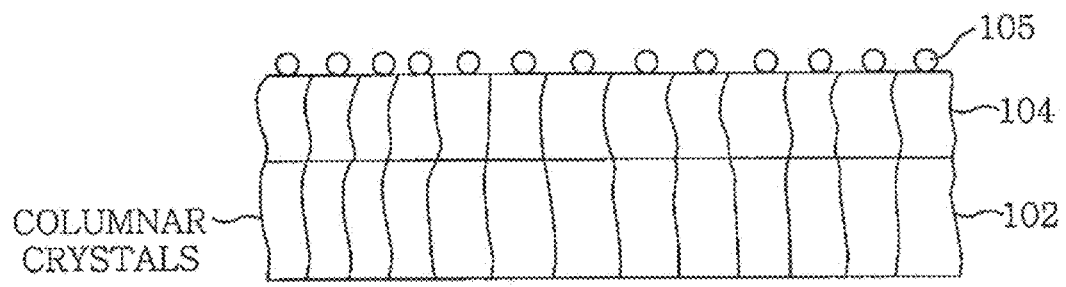
FIG. 6 is a schematic diagram showing a state in which an adsorption process is performed.

The adsorption process in step 4 includes supplying an adsorption gas containing a material for forming nuclei into the processing chamber 2, and forming the nuclei 105 by adsorbing the gas onto the initial tungsten film 104 having columnar crystals as shown in FIG. 6 to block the crystallinity of the initial tungsten film 104. The adsorption process time depends on the flow rate of the adsorption gas, but it is preferably not less than 10 seconds. The adsorption process in this embodiment includes supplying the $SiH_4$ gas that is a Si compound as an adsorption gas into the processing chamber 2, and adsorbing the $SiH_4$ gas onto the surface of the initial tungsten film 104 to form the nuclei 105 of Si. In this case, actually, $SiH_4$ is thermally decomposed and adsorbed as $SiH_x$ (x<4). At this time, the $H_2$ gas is also introduced to prevent the $SiH_4$ gas from being thermally decomposed locally. The adsorption of the $SiH_4$ gas may be performed to form a very thin film such as a monomolecular film. Therefore, the amount of Si to be adsorbed is very small almost without increasing the resistance of the tungsten film.

Preferable ranges of conditions for the adsorption process in the case of using the $SiH_4$ gas as an adsorption gas are as follows:
Temperature: 350 to 500° C. (temperature of the mounting table)
Pressure in the process container: 500 to 20000 Pa
$SiH_4$ flow rate: 300 to 800 sccm (mL/min)
$H_2$ flow rate: 100 to 1000 sccm (mL/min)
Time: 10 to 120 sec
For example, specific conditions are as follows:
Temperature: 410° C.
Pressure in the process container: 1000 Pa
$SiH_4$ flow rate: 700 sccm (mL/min)
$H_2$ flow rate: 500 sccm (mL/min)
Time: 20 sec
Further, as the adsorption gas used in the adsorption process, $Si_2H_6$, $SiH_2Cl_2$, $B_2H_6$, $H_2$, $PH_3$ or the like may be used without being limited to the $SiH_4$ gas. In the case of using $B_2H_6$, $H_2$, $PH_3$ as an adsorption gas, B, P and H are formed as nuclei respectively. However, it is preferable that the nuclei of Si are formed using a silicon compound such as $SiH_4$, $Si_2H_6$, and $SiH_2Cl_2$.

The crystallinity blocking tungsten film 106 formed by step 5 is formed as a tungsten film that does not take over the crystallinity of the initial tungsten film 104 by adsorbing the gas by the adsorption process of step 4 to form the nuclei of Si or the like on the surface, and has an effect of blocking the crystallinity of the main tungsten film 107 to be formed subsequently from the crystallinity of the initial tungsten film.

The deposition of the crystallinity blocking tungsten film is performed by CVD in which the $WF_6$ gas that is a raw material gas of tungsten and the $H_2$ gas that is a reducing gas are supplied into the processing chamber 2 and allowed to react with each other on the heated wafer S. At this time, a predetermined amount of either or both of the Ar gas and the $N_2$ gas may be allowed to flow.

The crystallinity blocking tungsten film 106 needs to be denser to have a high blocking property and make it easier to grow crystals of the main tungsten film. Therefore, the deposition of the crystallinity blocking tungsten film 106 is performed by setting the pressure to a low pressure and reducing the flow rate of the $WF_6$ gas, which is a raw material of tungsten, compared to that during the deposition of the main tungsten film 107. In addition, since the resistivity of the film tends to increase when the thickness of the crystallinity blocking tungsten film 106 is larger than 12 nm, the thickness of the crystallinity blocking tungsten film 106 is preferably equal to or less than 11.5 nm. Further, the thickness of the crystallinity blocking tungsten film 106 is preferably equal to or greater than 0.5 nm from the viewpoint of further enhancing the effect.

Preferable ranges of conditions for deposition of the crystallinity blocking tungsten film are as follows:
Temperature: 350 to 500° C. (temperature of the mounting table)
Pressure: 100 to 26667 Pa
$WF_6$ flow rate: 5 to 200 sccm (mL/min)
$H_2$ flow rate: 100 to 12000 sccm (mL/min)
Ar flow rate: 1000 to 14000 sccm (mL/min)
$N_2$ flow rate: 0 to 4000 sccm (mL/min)
Film thickness: 0.5 to 11.5 nm
For example, specific conditions are as follows:
Temperature: 410° C. (temperature of the mounting table)
Pressure: 1000 Pa
$WF_6$ flow rate: 60 sccm (mL/min)
$H_2$ flow rate: 4000 sccm (mL/min)
Ar flow rate: 6000 sccm (mL/min)
$N_2$ flow rate: 2000 sccm (mL/min)
Film thickness: 6 nm The main tungsten film 107 deposited in step 6 is intended to completely fill up the contact holes or the via holes. Similarly to the crystallinity blocking tungsten film 106, the deposition of the main tungsten film 107 is performed by CVD in which the $WF_6$ gas that is a raw material gas of tungsten and the $H_2$ gas that is a reducing gas are supplied into the processing chamber 2 and allowed to react with each other on the heated wafer S. At this time, a predetermined amount of either or both of the Ar gas and the $N_2$ gas may be allowed to flow. In order to fill up the contact holes or the via holes with a desired throughput, the deposition of the main tungsten film 107 is performed by setting the pressure to a high pressure and increasing the flow rate of the $WF_6$ gas, which is a raw material gas, compared to that during the deposition of the crystallinity blocking tungsten film 106.

Figure 7:
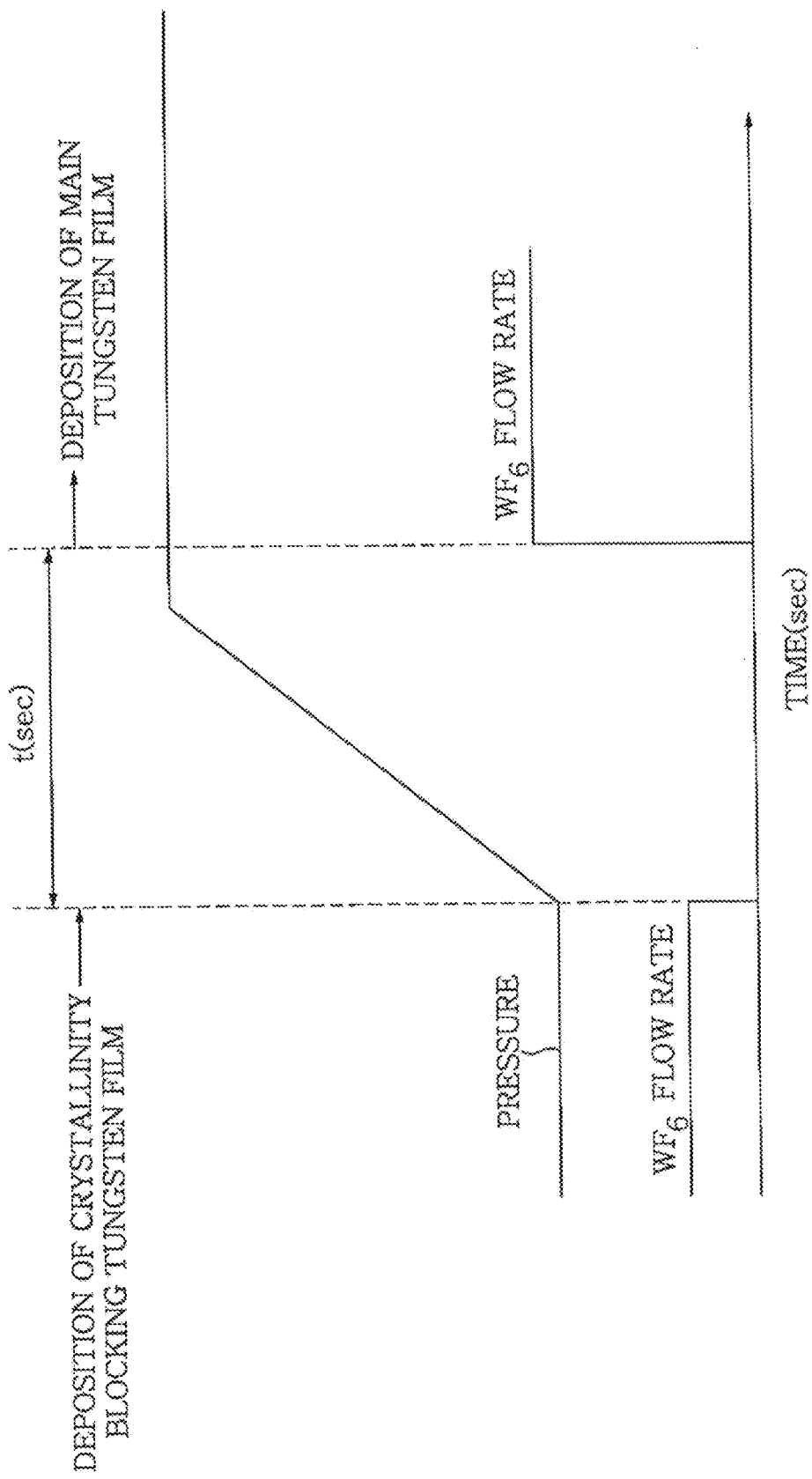
FIG. 7 is a diagram illustrating a change in pressure and a change in $WF_6$ flow rate in the deposition of the crystallinity blocking tungsten film and the deposition of the main tungsten film, and between them.

At the time of deposition of the main tungsten film 107, from the viewpoint of further lowering the resistance of the film, the main tungsten film 107 is preferably formed discontinuously with the crystallinity blocking tungsten film 106. That is, as shown in FIG. 7, after the deposition of the crystallinity blocking tungsten film 106, when increasing the pressure to a pressure during deposition of the main tungsten film 107, the supply of the $WF_6$ gas is stopped. Further, from the viewpoint of forming a film with a lower resistance, the time t until the start of the deposition of the main tungsten film 107 after completion of the deposition of the crystallinity blocking tungsten film 106 is preferably set in a range from 20 to 270 seconds. By setting the time t in this range, the deposition rate of the main tungsten film is slightly reduced. Accordingly, the resistivity of the main tungsten film tends to decrease.

Preferable ranges of conditions for deposition of the main tungsten film are as follows:
Temperature: 350 to 500° C. (temperature of the mounting table)
Pressure: 2666 to 26667 Pa
$WF_6$ flow rate: 150 to 700 sccm (mL/min)
$H_2$ flow rate: 1000 to 12000 sccm (mL/min)
Ar flow rate: 1000 to 14000 sccm (mL/min)
$N_2$ flow rate: 0 to 4000 sccm (mL/min)
For example, specific conditions are as follows:
Temperature: 410° C. (temperature of the mounting table)
Pressure: 10666 Pa
$WF_6$ flow rate: 250 sccm (mL/min)
$H_2$ flow rate: 2200 sccm (mL/min)
Ar flow rate: 4000 sccm (mL/min)
$N_2$ flow rate: 2000 sccm (mL/min)

In addition, preferable ranges of conditions for increasing the pressure from a pressure during deposition of the crystallinity blocking tungsten film to a pressure during deposition of the main tungsten film are as follows:
$H_2$ flow rate: 1000 to 12000 sccm (mL/min)
Ar flow rate: 1000 to 14000 sccm (mL/min)
$N_2$ flow rate: 0 to 4000 sccm (mL/min)
Pressure increase speed: 35 to 1000 Pa/sec
For example, specific conditions are as follows:
$H_2$ flow rate: 6000 sccm (mL/min)
Ar flow rate: 7000 sccm (mL/min)
$N_2$ flow rate: 2000 sccm (mL/min)
Pressure increase speed: 950 Pa/sec As described above, by depositing the initial tungsten film by ALD or SFD using the $WF_6$ gas and the $H_2$ gas, Si or B is prevented from being incorporated into the film, and the adsorption process and the presence of the crystallinity blocking tungsten film enable large-grain growth of the main tungsten film without being affected by the crystallinity of the initial tungsten film. Accordingly, the formed tungsten film has few impurities and large crystal grains, and the tungsten film having a resistivity significantly smaller than that in the conventional case can be obtained. Further, since a $B_2H_6$ gas is not used as a reducing gas, it is possible to prevent the adhesion with the underlying film from being deteriorated by diffusion of B, or prevent the electrical characteristics from being deteriorated.

Further, by depositing the main tungsten film discontinuously with the crystallinity blocking tungsten film, and setting the time until the start of the deposition of the main tungsten film after completion of the deposition of the crystallinity blocking tungsten film in the range from 20 to 270 seconds, it is possible to further reduce the resistivity of the film. Specifically, the resistivity is about 28 μΩcm at the film thickness of 50 nm in the conventional W film obtained by performing initial deposition using $SiH_4$ reduction, whereas the resistivity can be significantly reduced to about 10 μΩcm in this embodiment.

Second Example

Figure 8:
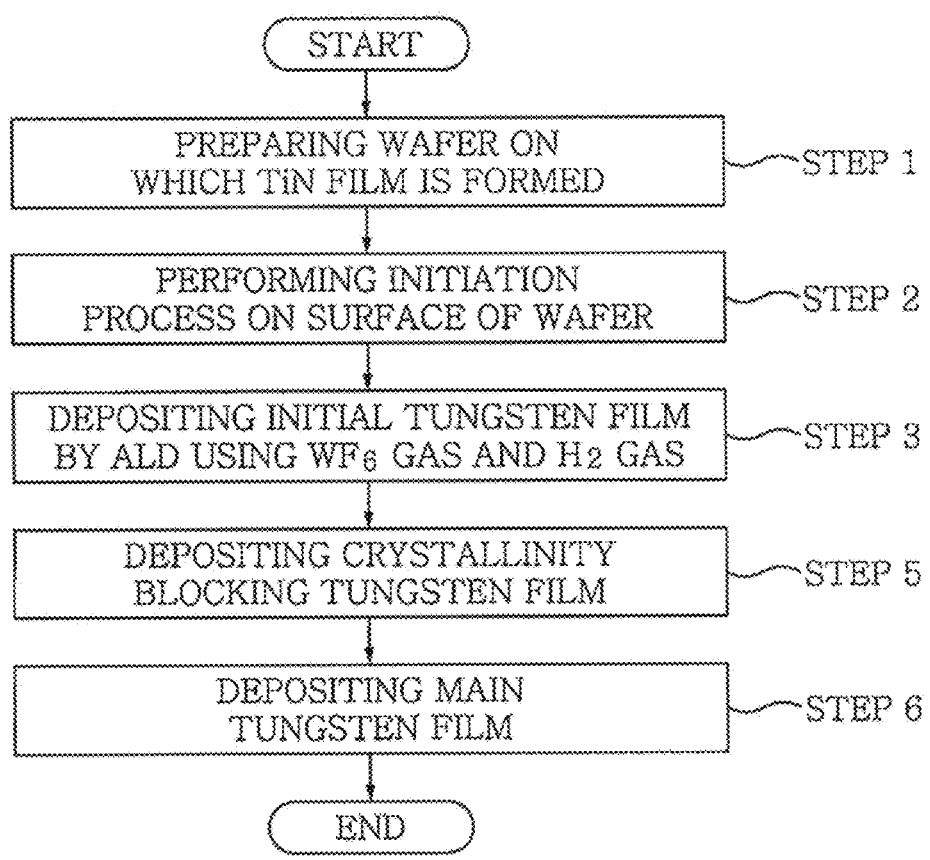
FIG. 8 is a flowchart of a film forming method in accordance with a second example of the first embodiment of the present invention.

FIG. 8 is a flowchart of a film forming method in accordance with a second example of the first embodiment of the present invention. This example is different from the first example in that the adsorption process of step 4 of the first example is not performed, and the other steps are performed in the same manner as the first example. That is, the wafer S having the structure of FIG. 3A is loaded into the processing chamber 2 (step 1), the initiation process is performed if necessary (step 2), the initial tungsten film is formed (step 3), the crystallinity blocking tungsten film is formed (step 5), and the main tungsten film is formed (step 6).

These steps 1, 2, 3, 5 and 6 are performed in the same manner as the first example. Further, as in the first example, it is preferable to perform the deposition of the main tungsten film discontinuously with the crystallinity blocking tungsten film. Also, it is preferable to set the time until the start of the deposition of the main tungsten film after completion of the deposition of the crystallinity blocking tungsten film in the range from 20 to 270 seconds.

In this example, since the adsorption process is not performed, the effect of blocking the crystallinity of the main tungsten film from the crystallinity of the initial tungsten film is somewhat reduced compared to the first embodiment. However, since the effect is maintained by the crystallinity blocking tungsten film, it is possible to obtain a tungsten film having a resistivity smaller than the conventional case. Specifically, the resistivity is about 28 μΩcm at the film thickness of 50 nm in the conventional W film obtained by performing initial deposition using $SiH_4$ reduction, whereas the resistivity can be reduced to about 13 μΩcm in this embodiment.

Third Example

Figure 9:
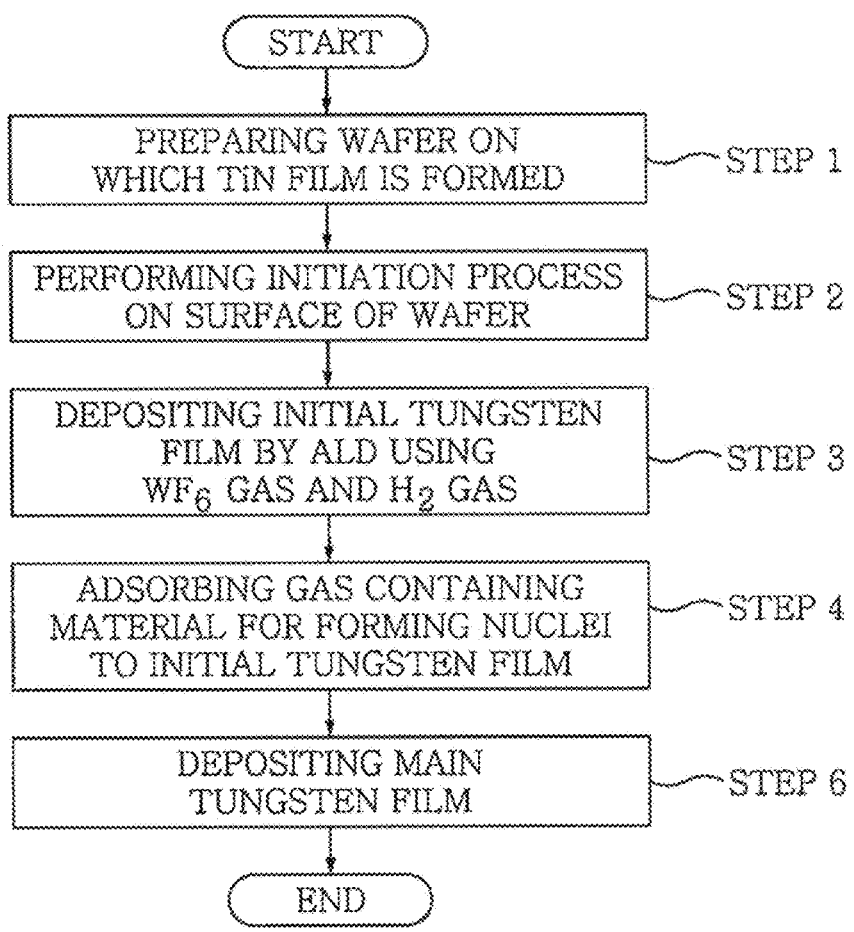
FIG. 9 is a flowchart of a film forming method in accordance with a third example of the first embodiment of the present invention.

FIG. 9 is a flowchart of a film forming method in accordance with a third example of the first embodiment of the present invention. This example is different from the first example in that the deposition of the crystallinity blocking tungsten film of step 5 of the first example is not performed, and the other steps are performed in the same manner as the first example. That is, the wafer S having the structure of FIG. 3A is loaded into the processing chamber 2 (step 1), the initiation process is performed if necessary (step 2), the initial tungsten film is formed (step 3), the adsorption process is performed (step 4), and the main tungsten film is formed (step 6).

These steps 1, 2, 3, 4 and 6 are performed in the same manner as the first example. Further, in the deposition of the main tungsten film, it is preferable to set the time until the start of the deposition of the main tungsten film after completion of the adsorption process in the range from 20 to 270 seconds. Accordingly, the deposition rate is slightly reduced in this range, and the resistivity tends to decrease.

In this example, since the deposition of the crystallinity blocking tungsten film is not performed, the effect of blocking the crystallinity of the main tungsten film from the crystallinity of the initial tungsten film is somewhat reduced compared to the first embodiment. However, since the effect is maintained by the adsorption process, it is possible to obtain a tungsten film having a resistivity smaller than before. Specifically, the resistivity is about 28 μΩcm at the film thickness of 50 nm in the conventional W film obtained by performing initial deposition using SiH$_4$ reduction, whereas the resistivity can be reduced to about 15 μΩcm in this embodiment.

Experimental Results in the First Embodiment

1. Experimental Example 1

In this case, according to the above procedure, the initiation process, the deposition of the initial tungsten film (film thickness: 10 nm) by ALD or SFD using the WF$_6$ gas as a raw material gas and the H$_2$ gas as a reducing gas, the adsorption process (20 seconds) using SiH$_4$, and the deposition of the crystallinity blocking tungsten film using the WF$_6$ gas and the H$_2$ gas (pressure: 1000 Pa, WF$_6$ flow rate: 60 sccm, H$_2$ flow rate: 4000 sccm, film thickness: 6 nm) were performed on the TiN film formed on the SiO$_2$ film. Then, after 70 seconds after completion of the deposition of the crystallinity blocking tungsten film, the deposition of the main tungsten film using the WF$_6$ gas and the H$_2$ gas (pressure: 10666 Pa, WF$_6$ flow rate: 250 sccm, H$_2$ flow rate: 2200 sccm) was performed, thereby fabricating the tungsten film (H$_2$ reduced film). The temperature was set to 410° C. in all steps. In addition, for comparison, the tungsten film (SiH$_4$ reduced film) was fabricated using the SiH$_4$ gas a reducing gas during deposition of the initial tungsten film by ALD or SFD, and the tungsten film (B$_2$H$_6$ reduced film) was fabricated using the B$_2$H$_6$ gas a reducing gas during deposition of the initial tungsten film by ALD or SFD.

Figure 10:
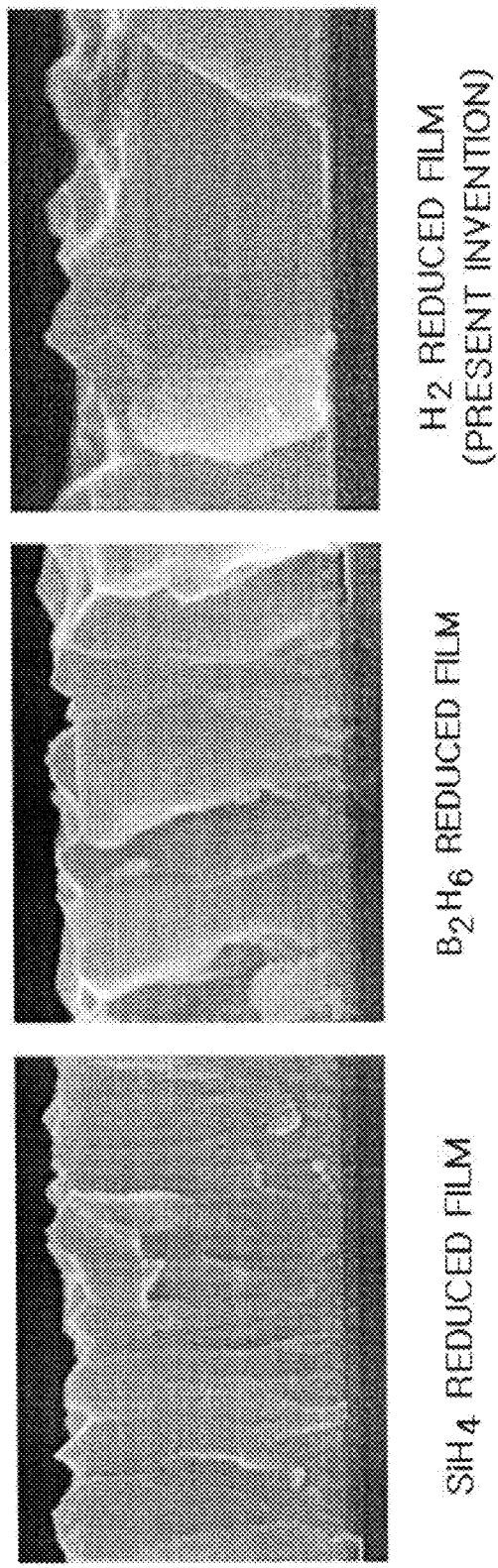
FIG. 10 illustrates scanning electron microscope (SEM) photographs showing crystalline states of the tungsten film of the present invention and the conventional tungsten films in which the initial deposition is performed by $SiH_4$ reduction and $B_2H_6$ reduction.

Scanning electron microscope (SEM) photographs of cross sections of these tungsten films were taken. The results thereof are shown in FIG. 10. As shown in FIG. 10, it can be seen that crystals of the tungsten films are columnar crystals in both the SiH$_4$ reduced film and the B$_2$H$_6$ reduced film, whereas crystal grains are largely grown in the H$_2$ reduced film.

Figure 11:
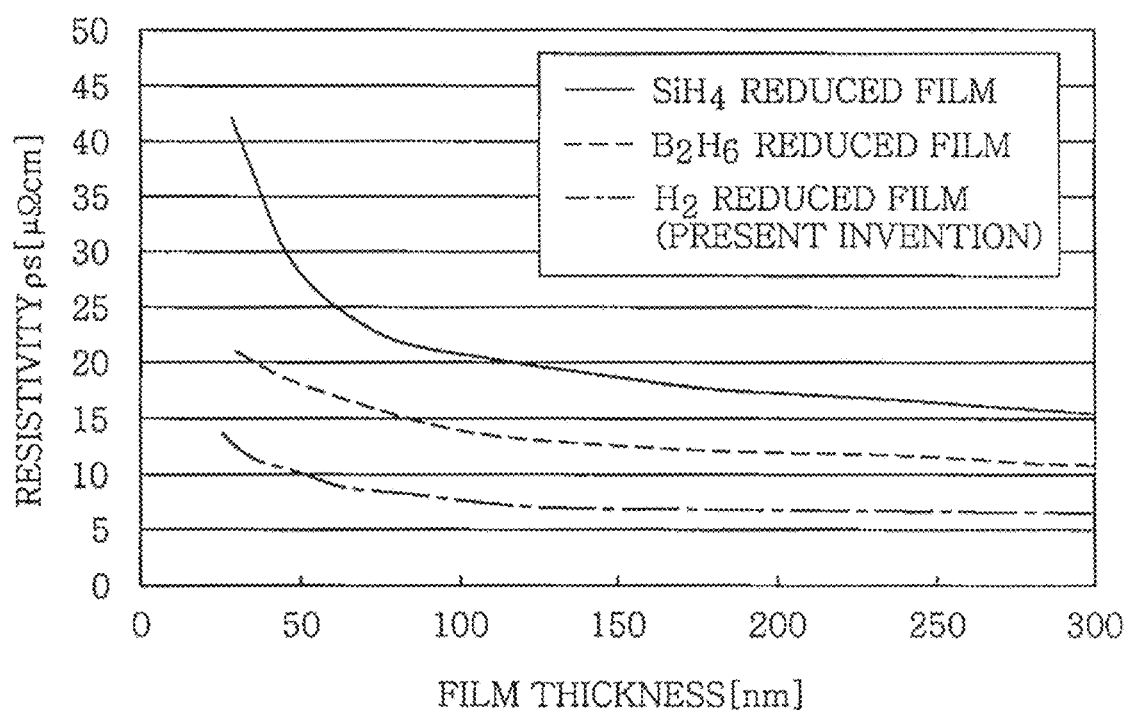
FIG. 11 shows a relationship between the film thickness and the resistivity of the tungsten film of the present invention and the conventional tungsten films in which the initial deposition is performed by $SiH_4$ reduction and $B_2H_6$ reduction.

FIG. 11 shows a relationship between the film thickness and the resistivity of these films, and it was observed that the resistivity of the H$_2$ reduced film is the lowest. It is considered that this is because crystal grains of the tungsten film are significantly grown in the H$_2$ reduced film.

Figure 12A:
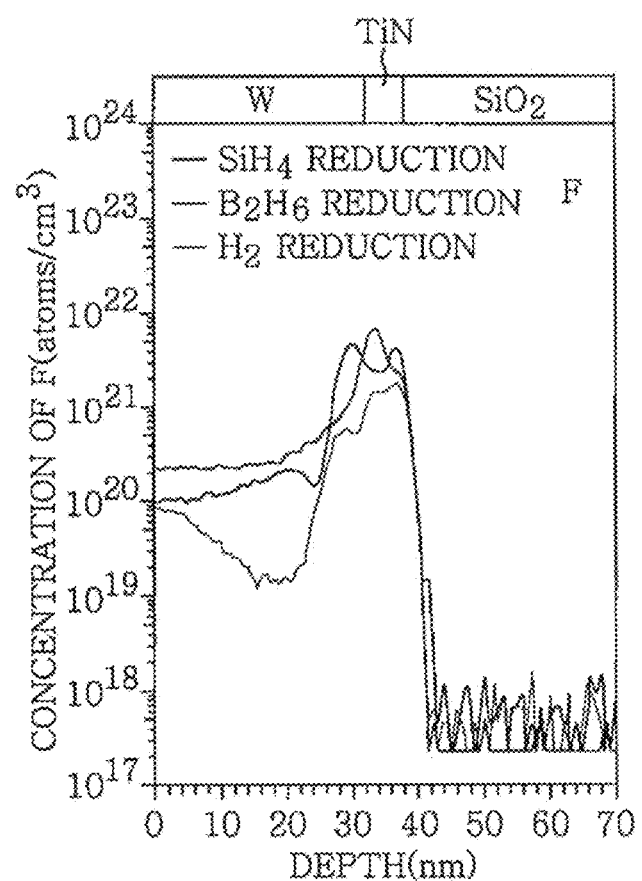
FIGS. 12A to 12C show the results of measuring the concentration of impurities (F, Si, B) of the initial tungsten film by $H_2$ reduction, the initial tungsten film by $SiH_4$ reduction, and the initial tungsten film by $B_2H_6$ reduction in the depth direction by secondary ion mass spectrometry (SIMS)
Figure 12B:
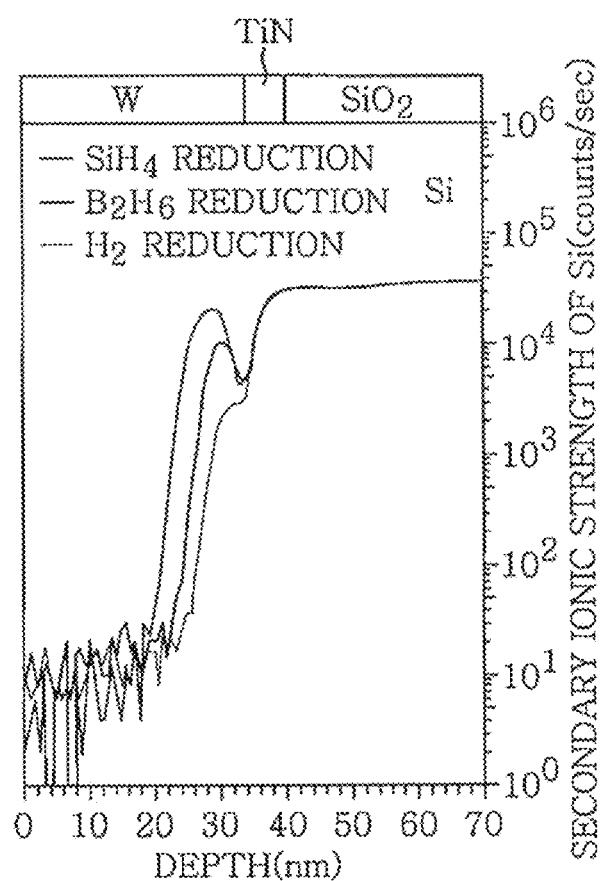
Figure 12C:
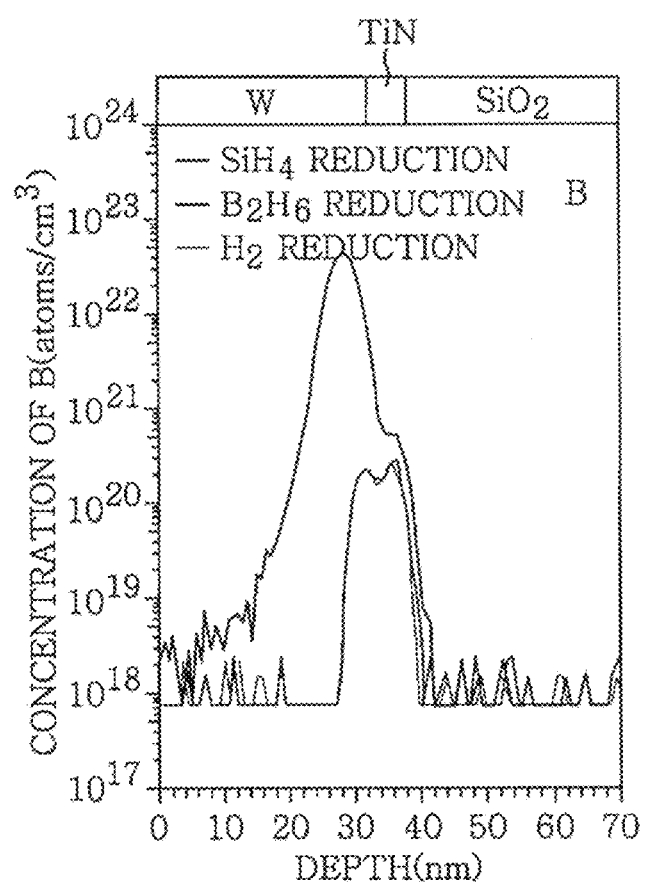

Then, samples in which only the initial tungsten film by H$_2$ reduction, the initial tungsten film by SiH$_4$ reduction, and the initial tungsten film by B$_2$H$_6$ reduction were respectively formed on the TiN film formed on the SiO$_2$ film were prepared, and the concentration of impurities (F, Si, B) in the depth direction was measured on these initial tungsten films by secondary ion mass spectrometry (SIMS). The results thereof are shown in FIGS. 12A to 12C. FIG. 12A shows the concentration of F, FIG. 12B shows the secondary ionic strength of Si, and FIG. 12C shows the concentration of B. As shown in FIGS. 12A to 12C, it can be seen that the initial tungsten film by H$_2$ reduction has an impurity concentration lower than those of the other initial tungsten films. Further, it was confirmed that the resistivity at the film thickness of 10 nm was 196 μΩcm in the initial tungsten film by SiH$_4$ reduction and 151 μΩcm in the initial tungsten film by B$_2$H$_6$ reduction, whereas it was 74 μΩcm in the initial tungsten film by H$_2$ reduction. Thus, it was confirmed that the resistivity decreased due to a low impurity concentration.

2. Experimental Example 2

In this case, according to the above procedure, the initiation process, and the deposition of the initial tungsten film (film thickness: 2 nm) by ALD or SFD using the WF$_6$ gas as a raw material gas and the H$_2$ gas as a reducing gas were performed on the TiN film formed on the SiO$_2$ film. Then, the adsorption process using SiH$_4$ was performed for 0 seconds (no adsorption process), 10 seconds, 20 seconds, 40 seconds (pressure: 1000 Pa, SiH$_4$ flow rate: 700 sccm). Then, the deposition of the crystallinity blocking tungsten film using the WF$_6$ gas and the H$_2$ gas (pressure: 1000 Pa, WF$_6$ flow rate: 60 sccm, H$_2$ flow rate: 4000 sccm, film thickness: 6 nm) was performed. Then, after 70 seconds after completion of the deposition of the crystallinity blocking tungsten film, the deposition of the main tungsten film using the WF$_6$ gas and the H$_2$ gas (pressure: 10666 Pa, WF$_6$ flow rate: 250 sccm, H$_2$ flow rate: 2200 sccm) was performed, thereby fabricating the tungsten film having a thickness of about 50 nm. The temperature was set to 410° C. in all steps.

Figure 13:
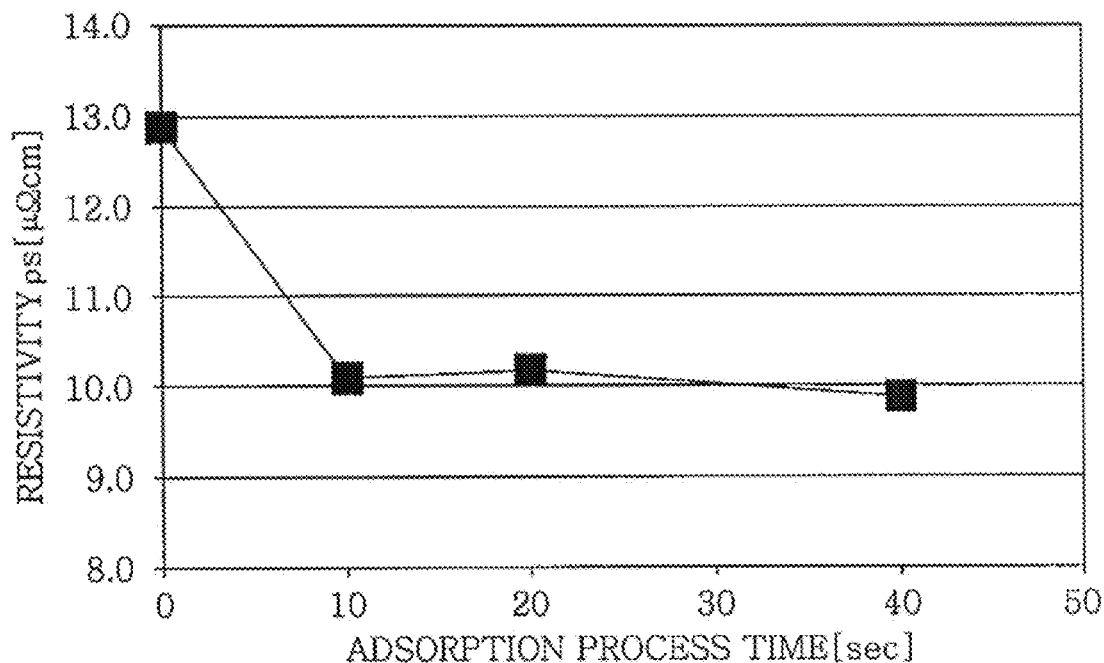
FIG. 13 shows a relationship between the adsorption process time and the resistivity of the obtained tungsten film.

For the tungsten film fabricated as described above, a relationship between the adsorption process time and the resistivity of the film is shown in FIG. 13. As shown in FIG. 13, it was confirmed that the resistivity was 13 μΩcm when the adsorption process was performed for 0 seconds (no adsorption process), whereas the resistivity was reduced to about 10 μΩcm regardless of the time by performing the adsorption process. However, even when no adsorption process was performed, the resistivity lower than the conventional case was obtained.

3. Experimental Example 3

In this case, the initiation process, and the deposition of the initial tungsten film (film thickness: 2 nm) by ALD or SFD using the WF$_6$ gas as a raw material gas and the H$_2$ gas as a reducing gas were performed on the TiN film formed on the SiO$_2$ film. Then, the adsorption process using SiH$_4$ was performed for 20 seconds, and the deposition of the crystallinity blocking tungsten film using the WF$_6$ gas and the H$_2$ gas (pressure: 1000 Pa, WF$_6$ flow rate: 60 sccm, H$_2$ flow rate: 4000 sccm) was performed to have a film thickness of 0 nm (no crystallinity blocking tungsten film), 3 nm, 6 nm, 12 nm. Then, after 70 seconds after completion of the deposition of the crystallinity blocking tungsten film, the deposition of the main tungsten film using the WF$_6$ gas and the H$_2$ gas (pressure: 10666 Pa, WF$_6$ flow rate: 250 sccm, H$_2$ flow rate: 2200 sccm) was performed, thereby fabricating the tungsten film. The temperature was set to 410° C. in all steps.

Figure 14:
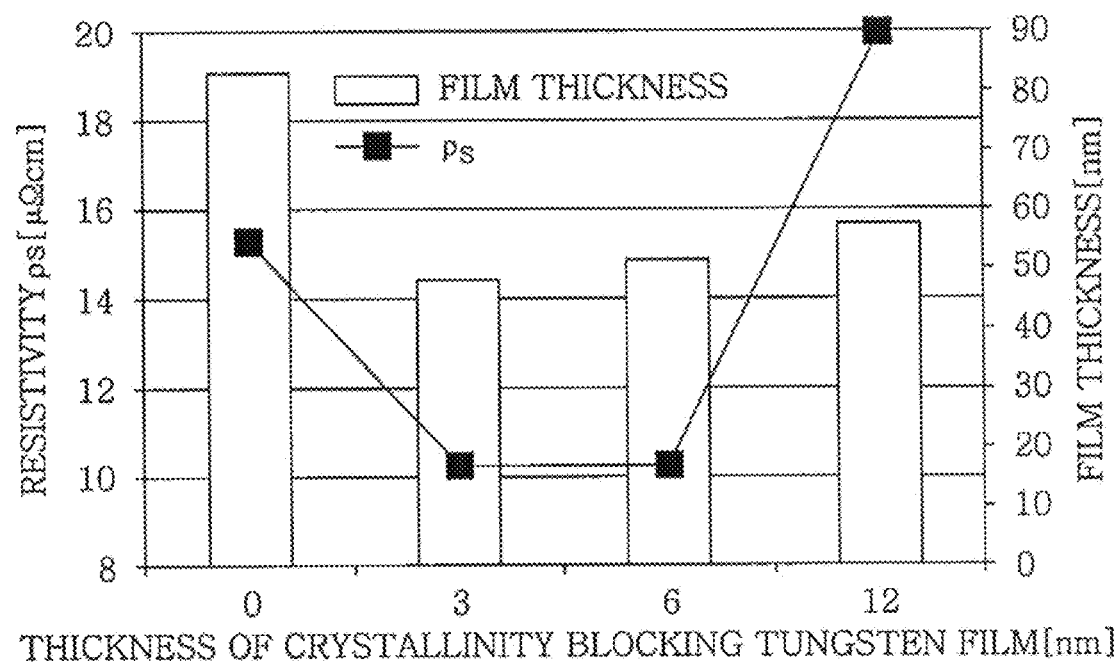
FIG. 14 shows a relationship between the film thickness of the crystallinity blocking tungsten film, and the film thickness and the resistivity of the film.

For the tungsten film fabricated as described above, a relationship between the film thickness of the crystallinity blocking tungsten film, and the film thickness and the resistivity of the film is shown in FIG. 14. As shown in FIG. 14, it can be seen that the resistivity was 15 μΩcm (it becomes a higher value at the film thickness of 50 nm because the film thickness is as large as 80 nm) when the crystallinity blocking tungsten film has a film thickness of 0 nm (no crystallinity blocking tungsten film), whereas the resistivity was reduced to about 10 μΩcm when the crystallinity blocking tungsten film has a film thickness of 3 nm, 6 nm. However, it was confirmed that the resistivity was 20 μΩcm, which is rather high when the crystallinity blocking tungsten film has a film thickness of 12 nm. Therefore, it was confirmed that the resistivity of the tungsten film was reduced by forming the crystallinity blocking tungsten film having a moderate thickness of about 0.5 to 11.5 nm. However, even when no crystallinity blocking tungsten film was formed, the resistivity lower than the conventional case was obtained.

4. Experimental Example 4

In this case, the initiation process, and the deposition of the initial tungsten film (film thickness: 2 nm) by ALD or SFD using the WF$_6$ gas as a raw material gas and the H$_2$ gas as a reducing gas were performed on the TiN film formed on the SiO$_2$ film. Then, the adsorption process using SiH$_4$ was performed for 20 seconds, and the deposition of the crystallinity blocking tungsten film using the WF$_6$ gas and the H$_2$ gas (pressure: 1000 Pa, WF$_6$ flow rate: 60 sccm, H$_2$ flow rate: 4000 sccm, film thickness 6 nm) was performed. Then, after 15 seconds, after 70 seconds, after 140 seconds, after 280 seconds after completion of the deposition of the crystallinity blocking tungsten film, the deposition of the main tungsten film using the WF$_6$ gas and the H$_2$ gas (pressure: 10666 Pa, WF$_6$ flow rate: 250 sccm, H$_2$ flow rate: 2200 sccm) was performed, thereby fabricating the tungsten film. The temperature was set to 410° C. in all steps.

Figure 15:
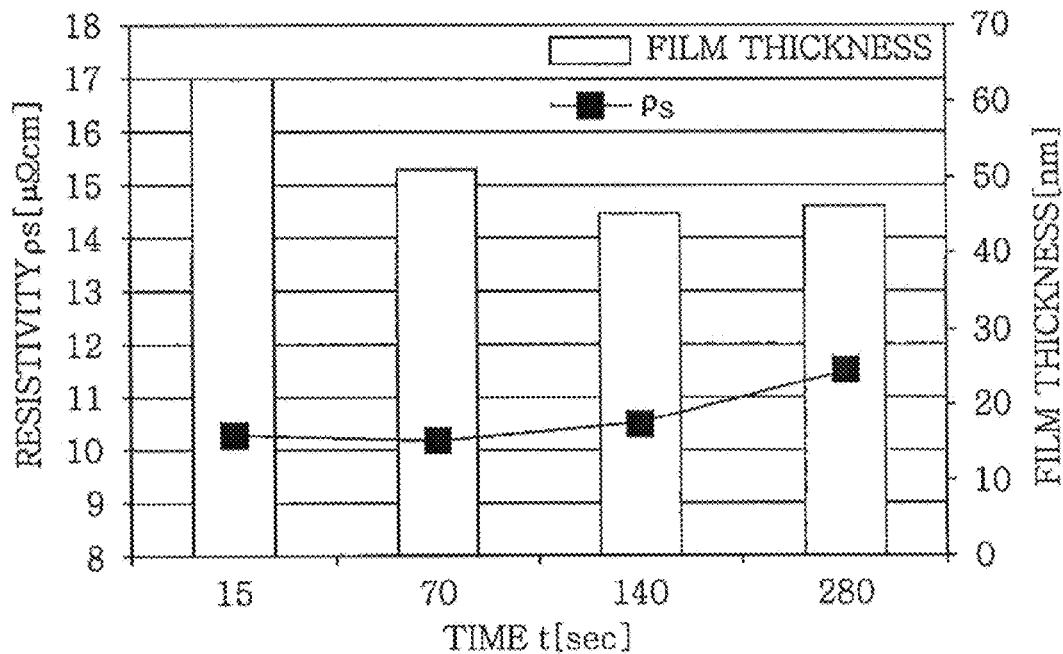
FIG. 15 shows a relationship between the time t (sec) until the start of the deposition of the main tungsten film after completion of the deposition of the crystallinity blocking tungsten film, and the film thickness and the resistivity of the film.

For the tungsten film fabricated as described above, a relationship between the time t (seconds) until the start of the deposition of the main tungsten film after completion of the deposition of the crystallinity blocking tungsten film, and the film thickness and the resistivity of the film is shown in FIG. 15. As shown in FIG. 15, it can be seen that there is a tendency that the deposition rate of the main tungsten film is reduced and the resistivity is reduced as the time t increases until it becomes 140 seconds. However, it can be seen that there is a tendency that the resistivity increases when the time t becomes 280 seconds. From this, it was confirmed that it is possible to further reduce the resistivity by setting the time until the start of the deposition of the main tungsten film after the completion of the deposition of the crystallinity blocking tungsten film to be about 20 to 270 seconds.

Figure 16:
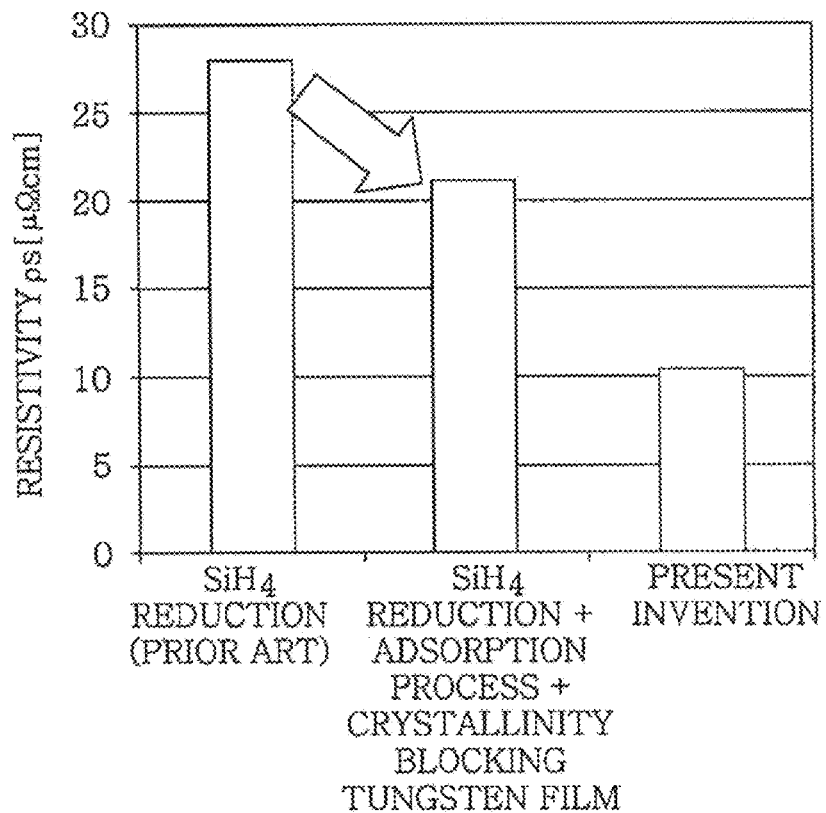
FIG. 16 shows results of comparing the resistivity of the tungsten film deposited under the optimum conditions of the present invention, the resistivity of the conventional tungsten film in which the initial tungsten film is deposited by $SiH_4$ reduction, and the resistivity of the tungsten film for reference formed by depositing the initial tungsten film by $SiH_4$ reduction, performing the adsorption process and the deposition of the crystallinity blocking tungsten film, and depositing the main tungsten film.

As described above, it was confirmed that an extremely low resistivity, which is 10 μΩcm at the film thickness of nm, was obtained by performing the deposition of the initial tungsten film using the H$_2$ gas as a reducing gas, performing the adsorption process and the deposition of the crystallinity blocking tungsten film under appropriate conditions, and performing the deposition of the main tungsten film while optimizing the time until the start of the deposition of the main tungsten film after the completion of the deposition of the crystallinity blocking tungsten film. In the conventional tungsten film obtained by depositing the initial tungsten film using the SiH$_4$ gas, the resistivity is 28 μΩcm at the film thickness of 50 nm. Thus, it was confirmed that the resistivity decreased by 65% compared to the conventional case. Further, for reference, the resistivity was measured when performing the deposition of the initial tungsten film using the SiH$_4$ gas as a reducing gas, performing the adsorption process and the deposition of the crystallinity blocking tungsten film under appropriate conditions, and performing the deposition of the main tungsten film while optimizing the time until the start of the deposition of the main tungsten film after the completion of the deposition of the crystallinity blocking tungsten film, and it was confirmed that the resistivity was reduced only to 20 μΩcm. FIG. 16 shows comparison of values of resistivity when the film thickness is 50 nm.

Second Embodiment

Next, a second embodiment will be described.

First, a description will be given of the experimental results serving as the premise of the present embodiment. The first embodiment is based on the experimental results obtained when the film thickness of the main tungsten film is about 50 nm, which is suitable for a conventional wiring or buried layer. However, recently, since there are applications of about 10 to 30 nm, the resistivity of the film was observed when the film thickness was varied.

The initiation process, and the deposition of the initial tungsten film (film thickness: 2 nm) by ALD or SFD using the WF$_6$ gas as a raw material gas and the H$_2$ gas as a reducing gas were performed on the TiN film formed on the SiO$_2$ film. Then, the adsorption process using SiH$_4$, and the deposition of the crystallinity blocking tungsten film were performed (case A), only the adsorption process using SiH$_4$ was performed (case B), only the deposition of the crystallinity blocking tungsten film was performed (case C), and both of them were not performed (case D). For these cases, after 70 seconds after the completion of the final process, the deposition of the main tungsten film was performed while varying the film thickness.

Figure 17:
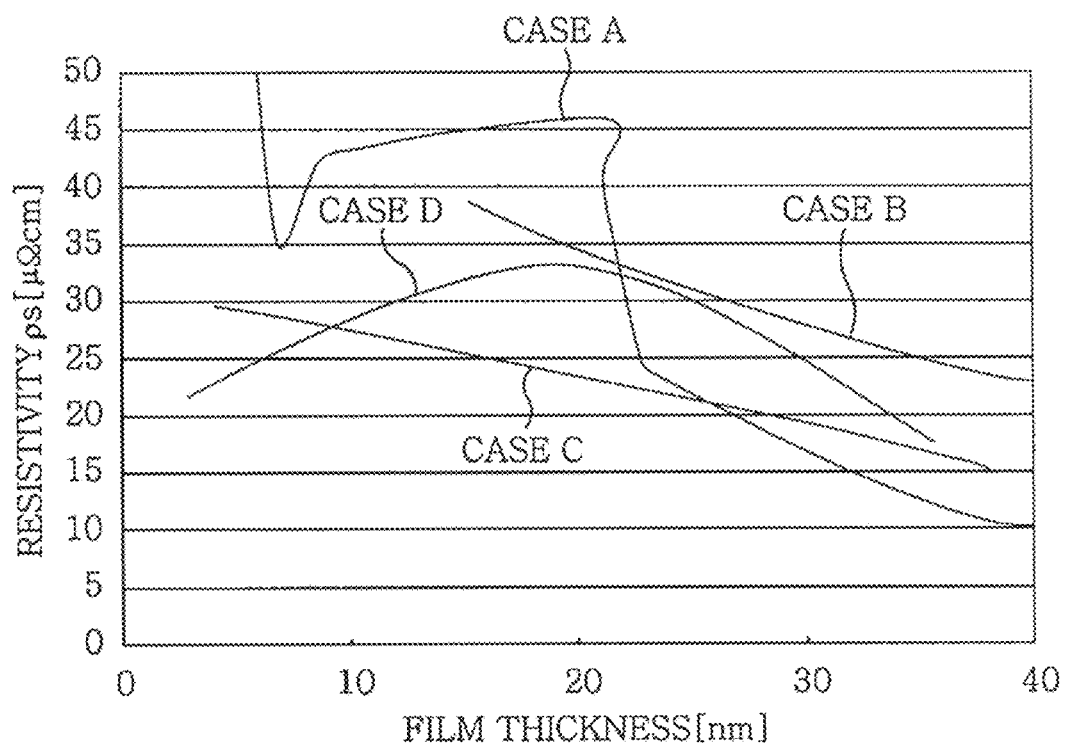
FIG. 17 shows a relationship between the resistivity and the film thickness when either or both of the adsorption process and the deposition of the crystallinity blocking tungsten film were performed (cases A to C), and both of them were not performed (case D)

The temperature was set to 410° C. in all steps, and the conditions of each process were as follows:

Adsorption process using SiH$_4$
Pressure: 1000 Pa
SiH$_4$ flow rate: 700 sccm
Time: 20 sec
Deposition of the crystallinity blocking tungsten film
Pressure: 1000 Pa
WF$_6$ flow rate: 60 sccm
H$_2$ flow rate: 4000 sccm
Film thickness: 6 nm
Deposition of the main tungsten film
Pressure: 10666 Pa
WF$_6$ flow rate: 250 sccm
H$_2$ flow rate: 2200 sccm FIG. 17 shows a relationship between the resistivity and the film thickness of the tungsten film formed as described above. As shown in FIG. 17, in case A where both of the adsorption process using SiH$_4$ and the deposition of the crystallinity blocking tungsten film were performed, it was found that the resistivity was low when the film thickness was equal to or greater than 25 nm, but the resistivity largely increased when the film thickness was equal to or less than 25 nm, particularly, around 10 to 25 nm. Also in the case where both of the adsorption process using SiH$_4$ and the deposition of the crystallinity blocking tungsten film were not performed, the resistivity slightly increased in the similar range of film thickness.

Figure 18:
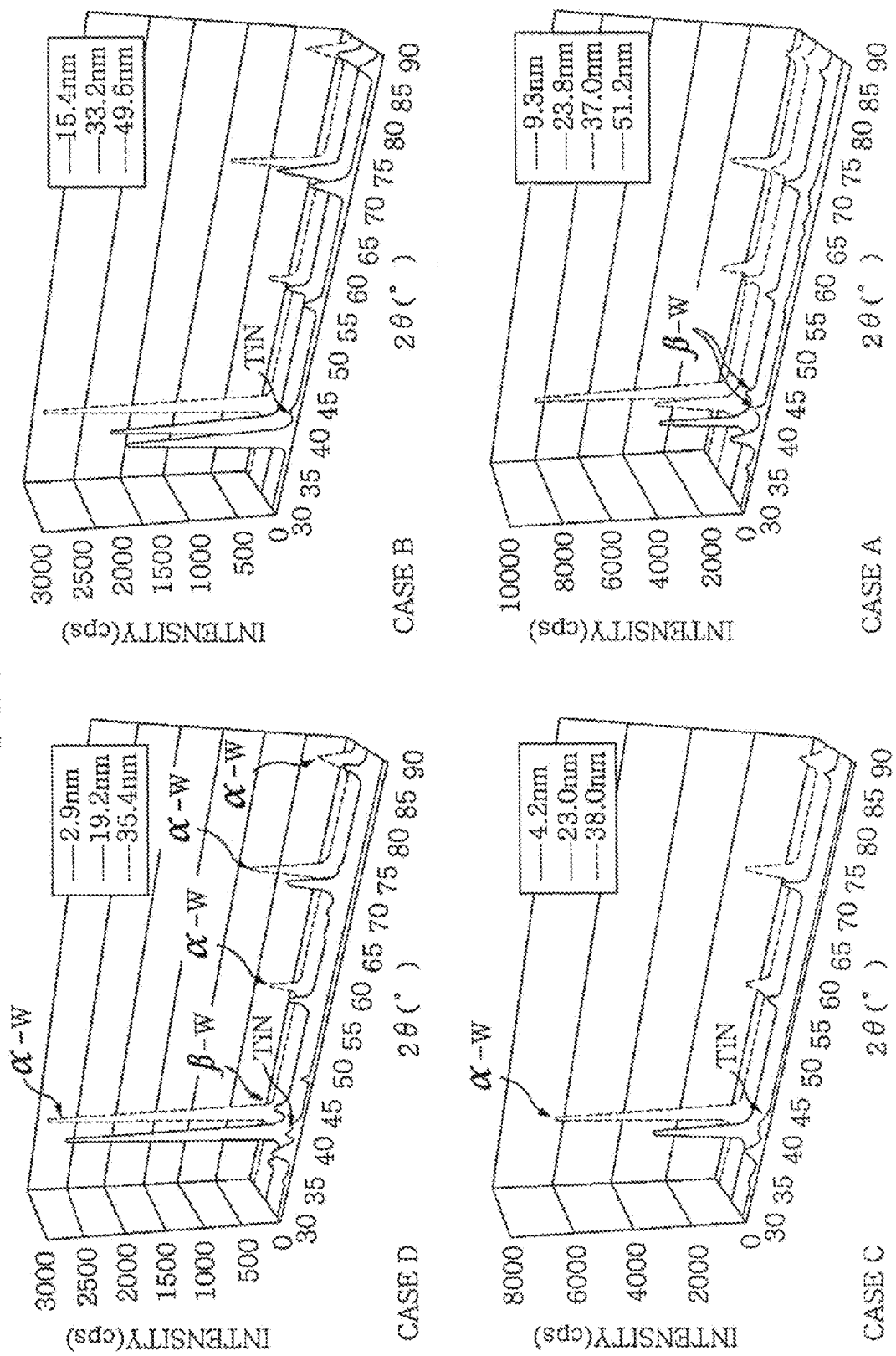
FIG. 18 shows the results of X-ray diffraction when the thickness of the main tungsten film was varied in cases A to D.

In order to investigate the cause of this increase in resistivity, X-ray diffraction was performed on the surface of these films. The results thereof are shown in FIG. 18. That is, in case A where both of the adsorption process using SiH$_4$ and the deposition of the crystallinity blocking tungsten film were performed, when the film thickness was 9.3 nm and 23.8 nm, relatively strong peaks indicating β-w were observed in addition to peaks indicating α-W. Further, also in case D where both of them were not performed, when the film thickness was 19.2 nm, some peaks indicating β-W were observed.

In tungsten (W), there are two crystalline phases, i.e., α phase (α-W) and β phase (β-W), which are different in resistivity. That is, in a bulk material, the resistivity of α-W is 5.33 μΩcm (22° C.), whereas the resistivity of β-w is as high as 300 to 1000 μΩcm. Therefore, it is considered that the increase in resistivity at the film thickness of around 10 to 25 nm is due to the presence of β-W. Further, in case A where both of the adsorption process using SiH$_4$ and the deposition of the crystallinity blocking tungsten film were performed, since the peaks of α-W are extremely strong at the film thickness of about 50 nm, it is estimated that the presence of β-W serves to increase the crystallinity of α-W formed thereon.

Figure 19:
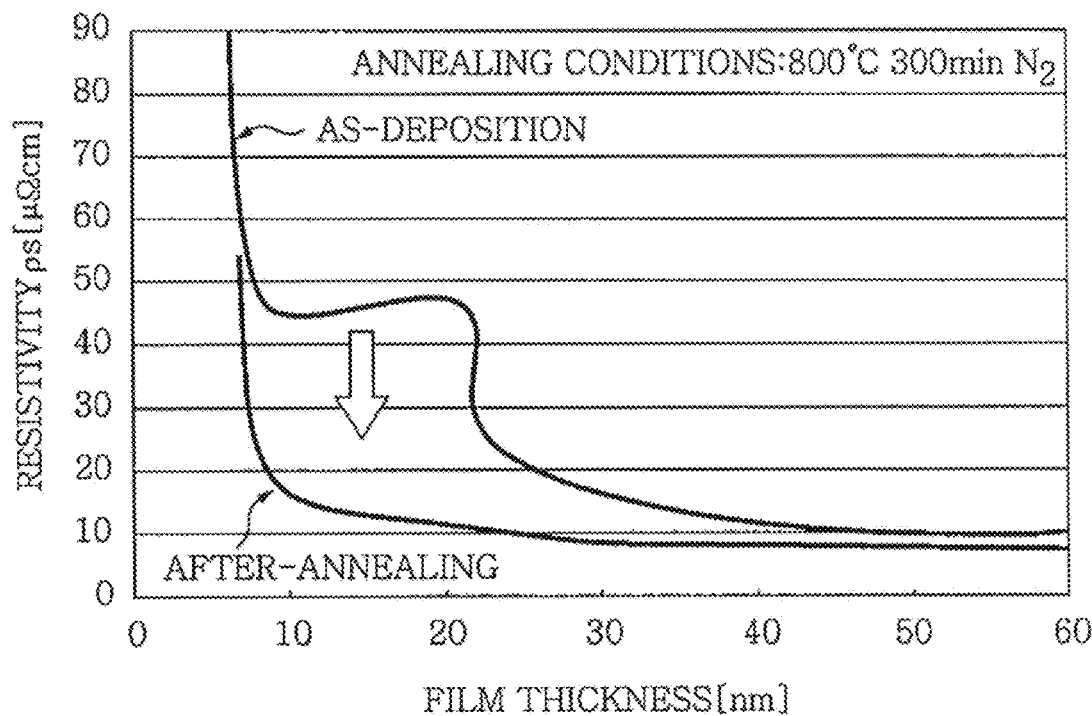
FIG. 19 is a diagram showing the results of measuring the resistivity when the deposition of the main tungsten film was performed while varying the film thickness, and when annealing was performed for 30 minutes at 800° C. in an atmosphere of $N_2$ gas after the deposition of the main tungsten film in case A.

Annealing was noted as a method to eliminate an increase in resistivity due to the presence of β-W. FIG. 19 is a diagram showing the results of measuring the resistivity when the deposition of the main tungsten film was performed while varying the film thickness, and when annealing was performed for 30 minutes at 800° C. in an atmosphere of N$_2$ gas after the deposition of the main tungsten film in case A where the adsorption process using SiH$_4$ and the deposition of the crystallinity blocking tungsten film were performed.

As shown in FIG. 19, the resistivity decreased as a whole by performing annealing after deposition. A reduction rate of the resistivity was large particularly when the film thickness was in the range of 10 to 25 nm.

Figure 20:
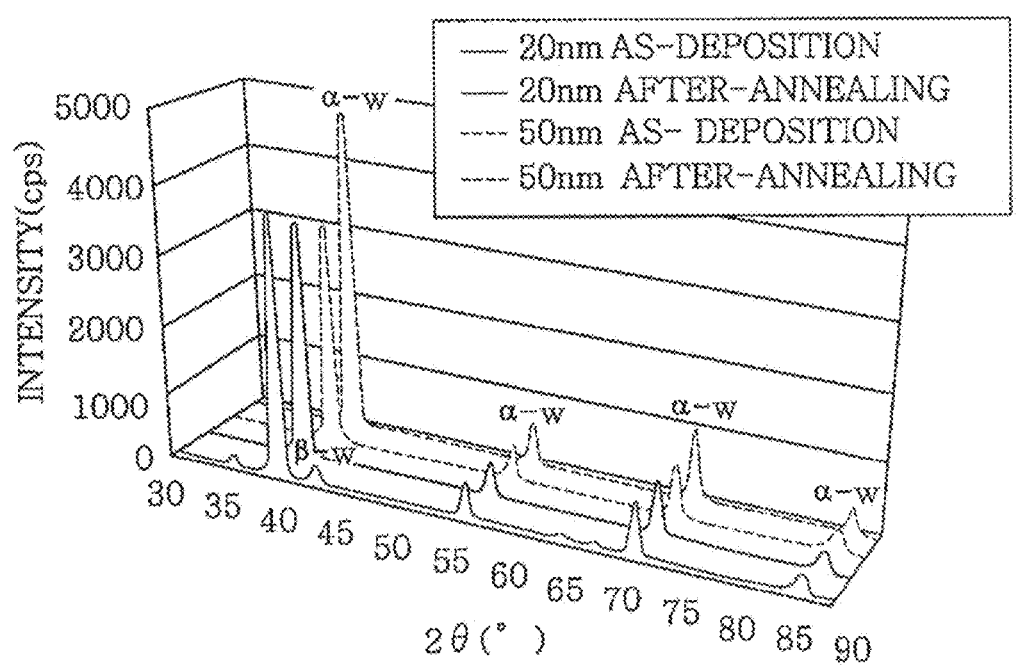
FIG. 20 shows the results of X-ray diffraction of an as-deposition state and an after-annealing state for the tungsten film in which the main tungsten film has a thickness of 20 nm and 50 nm.

Next, X-ray diffraction results of as-deposition state and after-annealing state were investigated for the film having a thickness of 20 nm and 50 nm. The results thereof are shown in FIG. 20. As shown in FIG. 20, it can be seen that at the film thickness of 20 nm, the peak of β-W exists in the as-deposition state, but the peak of β-W is eliminated by annealing. This strongly supports that the resistivity decreased as the crystal structure changes from β-W to α-W. Further, it is considered that at the film thickness of 50 nm, the peak of β-W does not exist before and after annealing, but the resistivity is lowered since internal β-W which is not detected by X-ray diffraction has been changed into α-W by annealing. In addition, it has been confirmed from FIG. 19 that the resistivity becomes an extremely low value of about 10 μΩcm when the film thickness is equal to or greater than 10 nm, particularly, an extremely low value of 8 μΩcm or less when the film thickness is equal to or greater than 40 nm by performing annealing.

Further, as a result of observing the surface and the cross section of the tungsten film after annealing, a volume change or difference in surface conditions due to annealing was not seen.

Figure 21:
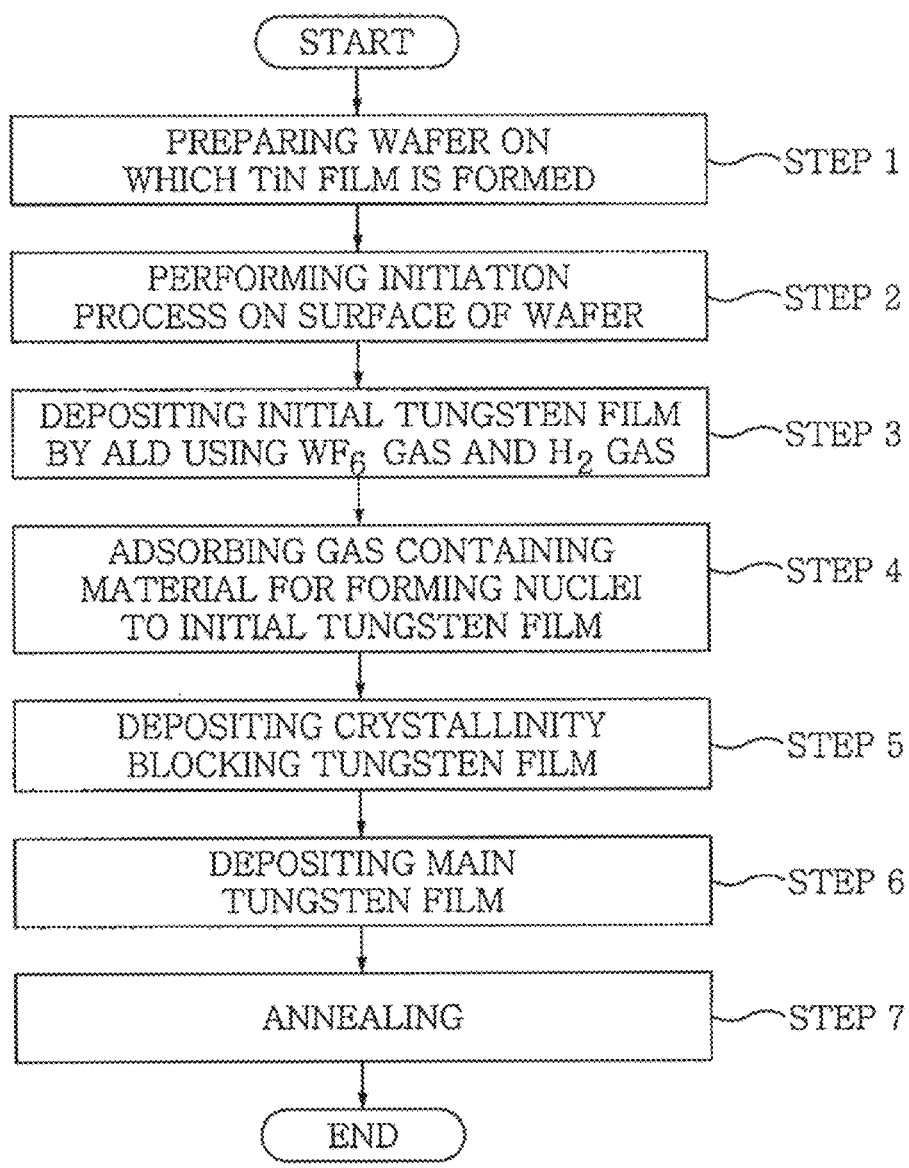
FIG. 21 is a flowchart of a film forming method in accordance with a second embodiment of the present invention.

Thus, in this embodiment, after depositing the main tungsten film as in the first to third examples of the first embodiment, annealing is performed. Specifically, the wafer S having the structure shown in FIG. 3A is prepared, and, as shown in FIG. 21, the wafer S is loaded into the processing chamber 2 (step 1). The initiation process is performed as necessary (step 2), and the initial tungsten film is deposited (step 3). The adsorption process is performed (step 4), and the crystallinity blocking tungsten film is deposited (step 5). The main tungsten film is deposited (step 6), and annealing is performed (step 7). Any one of step 4 and step 5 may be omitted.

Annealing is performed by purging the inside of the processing chamber 2 after completion of the deposition of the main tungsten film of step 6, and heating the wafer S through the mounting table 8 by the heating lamps 32 while introducing, into the processing chamber 2, a gas for forming an annealing atmosphere, e.g., the N$_2$ gas from the N$_2$ gas source 76. After the completion of step 6, annealing may be performed in an annealing apparatus which is provided separately.

Figure 22:
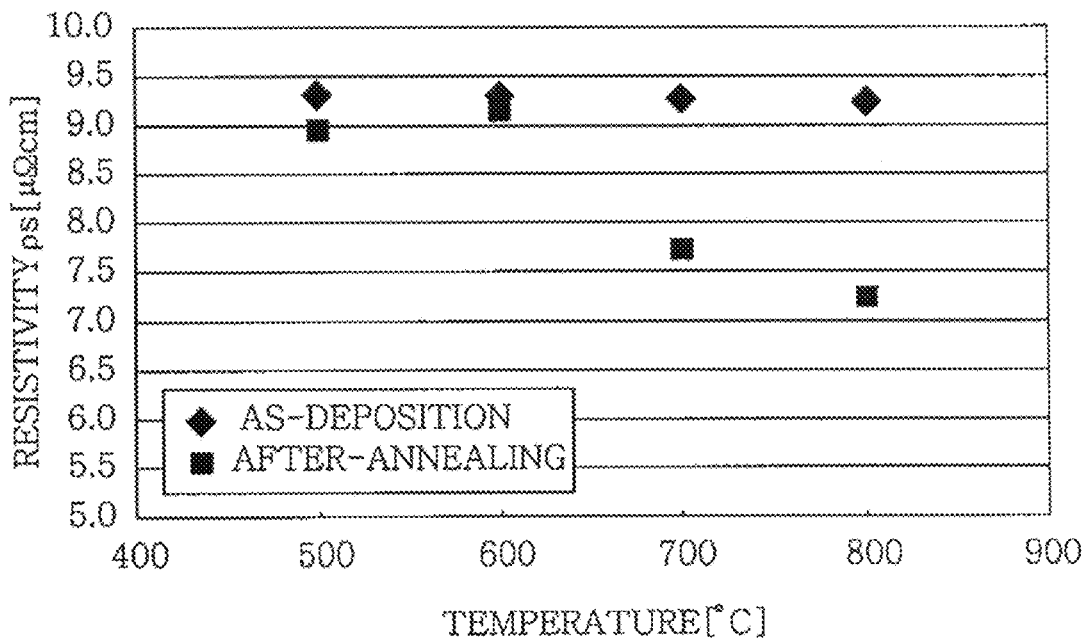
FIG. 22 shows the results of measuring the resistivity when annealing was performed on the tungsten film in which the thickness of the main tungsten film is 50 nm in the $N_2$ gas atmosphere by varying the annealing temperature between 500 and 800° C.

With regard to the heating temperature at this time, annealing was performed on the tungsten film in which the thickness of the main tungsten film is 50 nm in the N$_2$ gas atmosphere by varying the annealing temperature between 500 and 800° C., and the resistivity was measured. As a result, as shown in FIG. 22, it can be seen that the resistivity was almost the same value as that in the as-deposition state until the annealing temperature reached 600° C., but the resistivity decreased at the annealing temperature equal to or greater than 700° C. From this, it is preferable that the annealing temperature is equal to or greater than 700° C.

Figure 23:
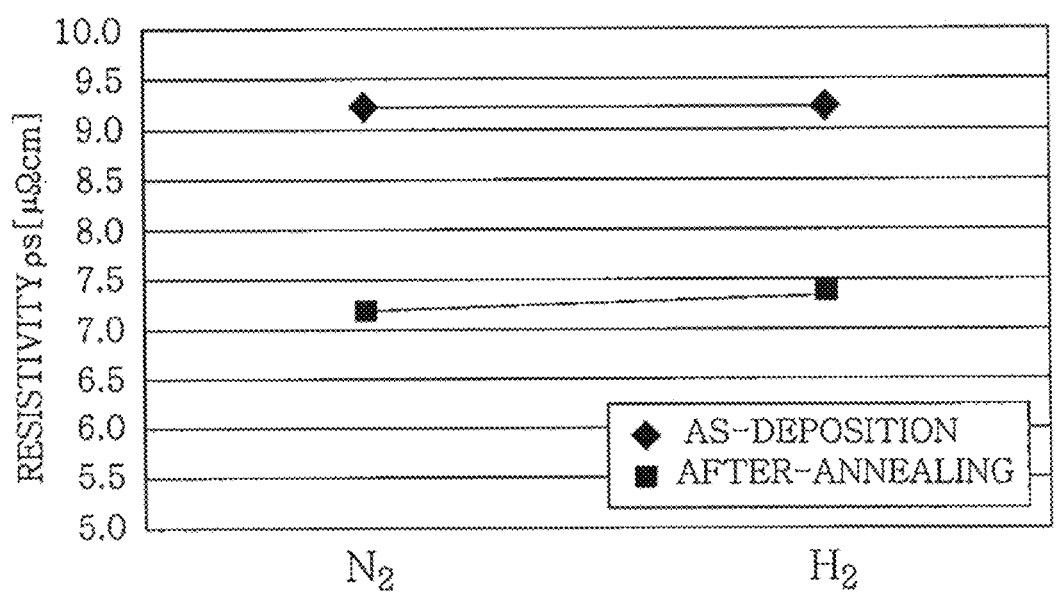
FIG. 23 shows the results of comparing the resistivity when the annealing atmosphere was set to the $N_2$ gas atmosphere and the resistivity when the annealing atmosphere was set to the $H_2$ gas atmosphere.

Further, with regard to the annealing atmosphere, annealing was performed on the tungsten film having a thickness of 50 nm at the temperature of 800° C. by varying the annealing atmosphere between the N$_2$ gas atmosphere and the H$_2$ gas atmosphere. As a result, as shown in FIG. 23, it can be seen that the value of the resistivity is substantially equal, and the effect of annealing does not depend on the atmosphere. Therefore, during the annealing, instead of the N$_2$ gas, the H$_2$ gas may be introduced into the processing chamber 2 from the H$_2$ gas source 78, and the Ar gas may be introduced into the processing chamber 2 from the Ar gas source 75. Other gas for annealing may be supplied. In the case where annealing is performed in the annealing apparatus provided separately, an appropriate gas may be introduced.

As described above, in this embodiment, by performing annealing after performing the initiation process, the deposition of the initial tungsten film by ALD or SFD using the H$_2$ gas as a reducing gas, the adsorption process using SiH$_4$, the deposition of the crystallinity blocking tungsten film using the WF$_6$ gas and the H$_2$ gas, and the deposition of the main tungsten film, β-W in the film is changed into α-W so that the resistivity of the film is reduced. In particular, at the film thickness equal to or less than 25 nm at which a large amount of β-W is crystallized and the resistivity is greatly increased, it is possible to obtain a large effect of reducing the resistivity. Further, also at the film thickness equal to or greater than 25 nm, by changing β-W remaining in the film into α-W, it is possible to further reduce the resistivity, and it is possible to obtain a low resistivity of 8 μΩcm or less, which cannot be expected in the conventional case.

The resistivity of the tungsten film obtained by performing the deposition and annealing in accordance with the present embodiment was actually compared with the resistivity of the tungsten film obtained by depositing the initial tungsten film using a conventional SiH$_4$ gas or B$_2$H$_6$ gas, depositing the main tungsten film, and performing annealing. As a result, in this embodiment, the resistivity was a significantly low value of 7.3 μΩcm (film thickness: 50 nm). On the other hand, in the case of using the SiH$_4$ gas and the B$_2$H$_6$ gas in the deposition of the initial tungsten film, the resistivity was decreased by annealing, but it was 18.4 μΩcm and 11.6 μΩcm, respectively, which are higher than that of the present embodiment.

Third Embodiment

Next, a third embodiment will be described.

In this case, it is based on the results of examining the influence of the thickness of the crystallinity blocking tungsten film in the case where the thickness of the main tungsten film is as small as 25 nm or less.

Figure 24:
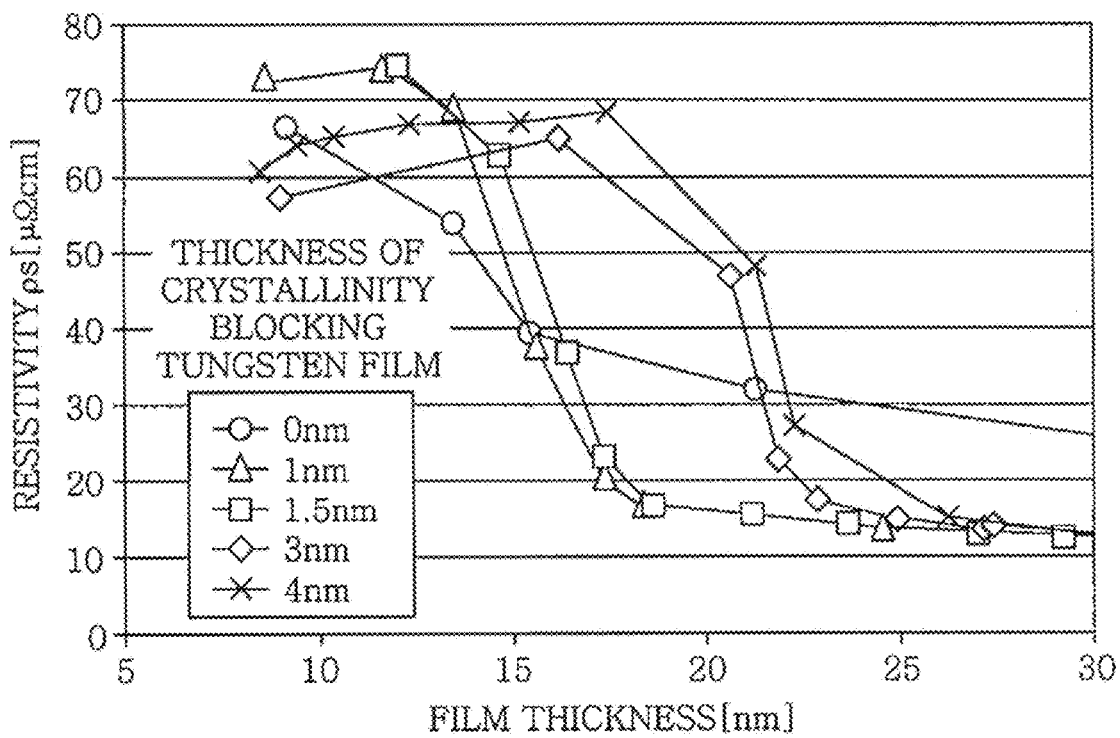
FIG. 24 is a diagram showing a relationship between the resistivity and the thickness of the main tungsten film when changing the thickness of the crystallinity blocking tungsten film.

FIG. 24 is a diagram showing a relationship between the resistivity and the thickness of the main tungsten film when changing the thickness of the crystallinity blocking tungsten film.

FIG. 24 shows the results of performing, on the TiN film, the initiation process, the deposition of the initial tungsten film, the adsorption process using SiH$_4$, the deposition of the crystallinity blocking tungsten film (including the case where there is no crystallinity blocking tungsten film), and the deposition of the main tungsten film under the following conditions.

Adsorption process using SiH$_4$
Pressure: 10666 Pa
SiH$_4$ flow rate: 700 sccm
Time: 60 sec
Deposition of the crystallinity blocking tungsten film
Pressure: 1000 Pa
WF$_6$ flow rate: 200 sccm
H$_2$ flow rate: 4000 sccm
Film thickness: 0 to 4 nm
Deposition of the main tungsten film
Pressure: 10666 Pa
WF$_6$ flow rate: 250 sccm
H$_2$ flow rate: 2200 sccm
Temperature
410° C. in all processes As shown in FIG. 24, it can be seen that when the thickness of the main tungsten film is equal to or greater than 25 nm, the resistivity is lower than the case where the crystallinity blocking tungsten film is not provided even when the crystallinity blocking tungsten film has any thickness, whereas when the thickness of the main tungsten film is equal to or greater than 25 nm, the rise in resistance caused by the above-described β-W increases as the thickness of the crystallinity blocking tungsten film becomes large. Specifically, if the thickness of the crystallinity blocking tungsten film is 4 nm, the increase of the resistivity has already begun when the thickness of the main tungsten film is 25 nm. If the thickness of the crystallinity blocking tungsten film is 3 nm, the increase of the resistivity begins when the thickness of the main tungsten film is about 22 nm. If the thickness of the crystallinity blocking tungsten film is 1.5 nm, the increase of the resistivity begins when the thickness of the main tungsten film is about 17 nm. If the thickness of the crystallinity blocking tungsten film is 1 nm, the increase of the resistivity begins when the thickness of the main tungsten film is about 16 nm.

Therefore, in the case where the thickness of the main tungsten film is equal to or greater than 25 nm, it is effective if the thickness of the crystallinity blocking tungsten film is equal to or greater than 0.5 nm. In the case where the thickness of the main tungsten film is equal to or less than 25 nm (10 to 25 nm), it is preferable that the thickness of the crystallinity blocking tungsten film is equal to or less than 3 nm, and it is more preferable that it is equal to or less than 1.5 nm. Further, the range of 0.5 to 3 nm is preferable, and the range of 0.5 to 1.5 nm is more preferable. In this embodiment, even when there is no step of adsorbing a gas containing a material for nucleation on the surface of the initial tungsten film (adsorption process using $SiH_4$), the same effect can be obtained. Further, annealing may be performed in the same manner as the second embodiment after performing the deposition under conditions of this embodiment.

Other Embodiments

Deposition of the Initial Tungsten Film

In the above embodiment, during deposition of the initial tungsten film, a purge between the supply of $WF_6$ gas which is a raw material gas of tungsten and the supply of $H_2$ gas which is a reducing gas was carried out by using the Ar gas and/or $N_2$ gas as a purge gas. However, by performing the purge only by vacuum evacuation, it is possible to reduce the resistivity of the tungsten film formed by the subsequent adsorption process, deposition of the crystallinity blocking tungsten film, and deposition of the main tungsten film.

Figure 25:
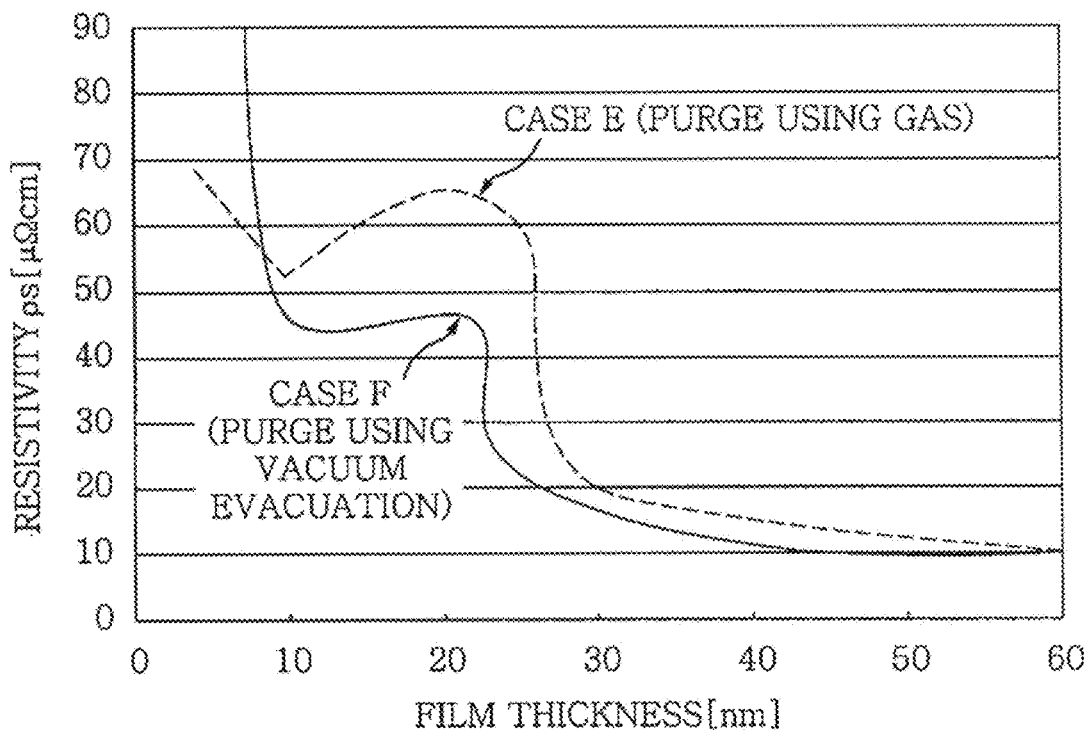
FIG. 25 is a diagram showing a relationship between the resistivity and the film thickness when the purge during deposition of the initial tungsten film was performed by using the Ar gas and $N_2$ gas as a purge gas (case E), and when the purge was performed by vacuum evacuation while stopping the supply of all gases (case F)

This is shown in FIG. 25. FIG. 25 is a diagram showing a relationship between the resistivity and the film thickness when the purge during deposition of the initial tungsten film was performed by using the Ar gas and/or $N_2$ gas as a purge gas (case E), and when the purge was performed by vacuum evacuation while stopping the supply of all gases (case F). Further, the time of one purge was set to 1.5 seconds, and the supply of $WF_6$ gas which is a raw material gas of tungsten and the supply of $H_2$ gas which is a reducing gas were repeated 27 times. The initial tungsten film was formed to have a thickness of 2 nm. The adsorption process, the deposition of the crystallinity blocking tungsten film, and the deposition of the main tungsten film were performed under the same conditions as those of the experiment in which the results of FIG. 17 were obtained. Further, the processing temperature was set to 410° C. in all processes.

As shown in FIG. 25, it was confirmed that the resistivity was reduced compared to the purge using the purge gas by performing the purge during deposition of the initial tungsten film by vacuum evacuation while stopping the supply of all gases. It is presumed that this is because the amount of impurities such as fluorine (F) in the film was decreased by the purge using vacuum evacuation. Further, in both cases, the resistivity becomes higher when the film thickness is around 10 to 25 nm.

Figure 26:
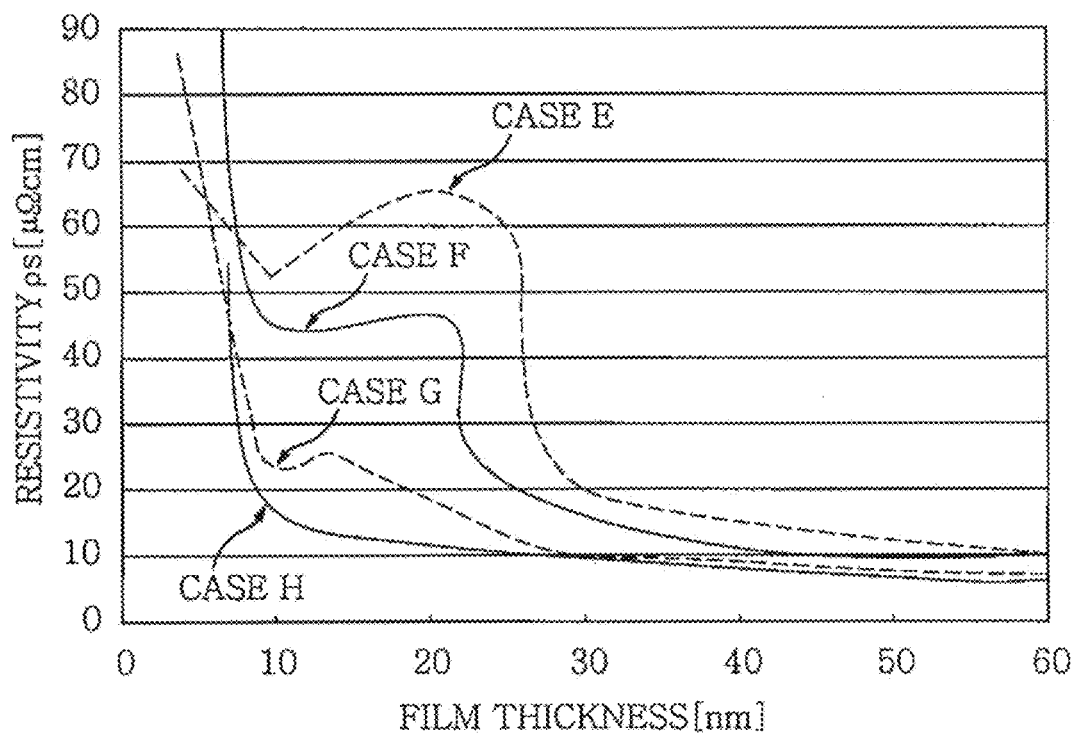
FIG. 26 is a diagram showing a relationship between the resistivity and the film thickness for case E and case F above, and case G and case H where the annealing was performed at 800° C. for 30 minutes in the $N_2$ gas atmosphere in these cases.

Also when the purge during deposition of the initial tungsten film is carried out by vacuum evacuation as described above, annealing after the deposition is effective. The results thereof are shown in FIG. 26. FIG. 26 is a diagram showing a relationship between the resistivity and the film thickness for case E and case F above, and case G and case H where the annealing was performed at 800° C. for 30 minutes in the $N_2$ gas atmosphere in these cases.

As shown in FIG. 26, by performing annealing, the resistivity was reduced in both cases of performing the purge during deposition of the initial tungsten film by using the purge gas and vacuum evacuation. Particularly, the reduction rate is large at the film thickness of 10 to 25 nm at which the resistivity is high. Also, for cases where annealing is performed, the lower resistivity was obtained in case H where the purge is performed by vacuum evacuation.

Initiation Process

Figure 27:
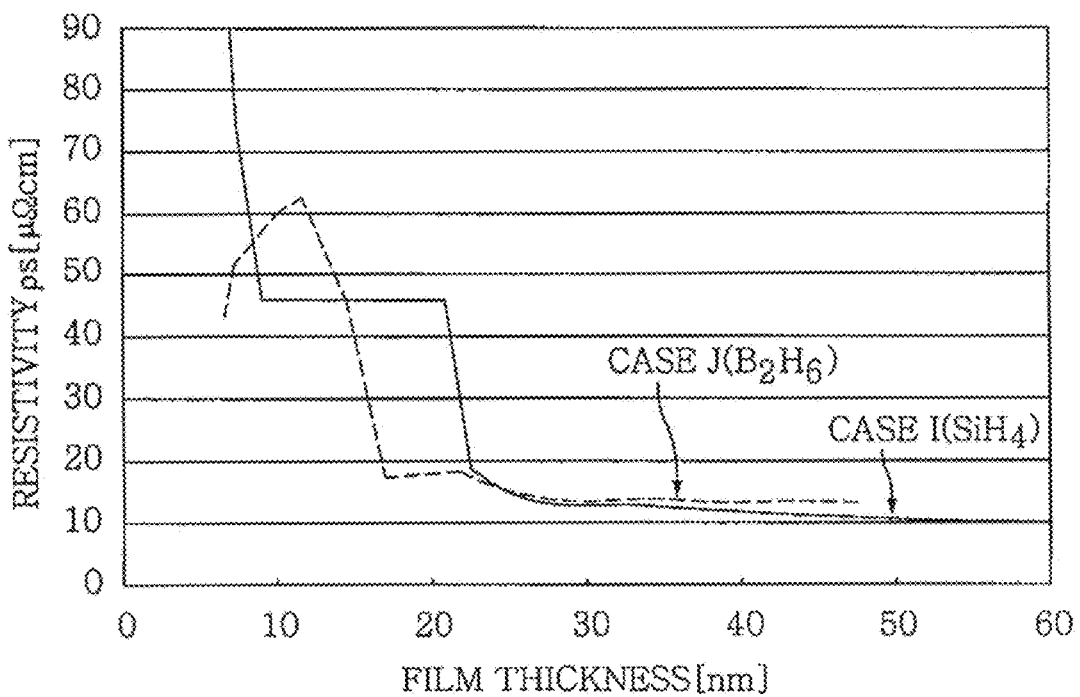
FIG. 27 is a diagram showing a relationship between the resistivity and the film thickness when the initiation process was performed using the $SiH_4$ gas (case I) and when the initiation process was performed using the $B_2H_6$ gas (case J).

Although an example in which the $SiH_4$ gas is used in the initiation process has been illustrated in the above embodiment, good results can be obtained even using the $B_2H_6$ gas. This is shown in FIG. 27. FIG. 27 a diagram showing a relationship between the resistivity and the film thickness when the initiation process was performed using the $SiH_4$ gas (case I) and when the initiation process was performed using the $B_2H_6$ gas (case J). The initiation process was performed on the TiN film formed on the $SiO_2$ film under conditions of pressure: 10666 Pa, $SiH_4$ flow rate: 700 sccm, $H_2$ flow rate: 500 sccm in case I, and performed under conditions of pressure: 10666 Pa, $B_2H_6$ flow rate: 35 sccm, $H_2$ flow rate: 1165 sccm in case J. Then, the deposition of the initial tungsten film (film thickness: 2 nm) by ALD or SFD using the $WF_6$ gas as a raw material gas and the $H_2$ gas as a reducing gas was performed. The subsequent adsorption process, deposition of the crystallinity blocking tungsten film, and deposition of the main tungsten film were performed under the same conditions as those of the experiment in which the results of FIG. 17 were obtained. Further, the processing temperature was set to 410° C. in all processes.

As shown in FIG. 27, the resistivity has increased in a portion where the film thickness is small in both cases. In the film thickness range of 15 to 23 nm, the resistivity is lower in case K where the initiation process was performed using $B_2H_6$. In the film thickness range of 23 nm or more, a low resistance value was obtained in both cases, and the resistivity in case I where the initiation process was performed using $SiH_4$ is lower than that in case J where the initiation process was performed using $B_2H_6$.

Among them, for a sample in which the thickness of the main tungsten film is 35 nm, the crystalline state of the surface was observed by electron backscatter diffraction (EBSD). As a result, the crystal grain size becomes larger when the initiation process is performed using $SiH_4$ than when the initiation process is performed using $B_2H_6$. Further, it has been confirmed that the amount of (110) planes to reduce the resistivity of W becomes larger when the initiation process is performed using $SiH_4$. Therefore, it can be seen that the initiation process using $SiH_4$ rather than using $B_2H_6$ is more effective.

Although the results are not shown, in either case, the resistivity is reduced by annealing after deposition, and the resistivity is lower when using $SiH_4$.

<Other Applications>

Although the embodiments of the present invention have been described, the present invention may be variously modified without being limited to the embodiments described above. For example, although an example in which all steps are performed at the same temperature has been described in the above embodiment, the temperature for each step may be changed and optimized. Further, although an example in which the TiN film is formed on the surface of the substrate and the tungsten film is deposited thereon has been described in the above embodiment, it is not limited to a case where the deposition is performed on the TiN film. Further, although an example in which a semiconductor wafer serves as a substrate to be processed has been described, the semiconductor wafer may include silicon, or a compound semiconductor such as GaAs, SiC and GaN. Further, it is not limited to the semiconductor wafer, and the present invention may be applied to, e.g., a ceramic substrate, or a glass substrate used in a flat panel display (FPD) such as a liquid crystal display.

While the invention has been shown and described with respect to the embodiments, it will be understood by those skilled in the art that various changes and modification may be made without departing from the scope of the invention as defined in the following claims.

What is claimed is:

1. A tungsten film forming method for forming a tungsten film on a surface of a substrate while heating the substrate in a depressurized atmosphere in a processing chamber, the method comprising:

forming an initial tungsten film for tungsten nucleation on the surface of the substrate by alternately repeating a supply of $WF_6$ gas which is raw material of tungsten and a supply of $H_2$ gas which is a reducing gas in the processing chamber while performing a purge in the processing chamber between the supplies of the $WF_6$ gas and the $H_2$ gas;

adsorbing a gas containing a material for nucleation onto a surface of the initial tungsten film;

depositing a crystallinity blocking tungsten film for blocking crystallinity of the initial tungsten film by supplying the $WF_6$ gas and the $H_2$ gas into the processing chamber; and after stopping the supply of the $WF_6$ gas and increasing a pressure in the processing chamber after completion of deposition of the crystallinity blocking tungsten film, depositing a main tungsten film by supplying the $WF_6$ gas and the $H_2$ gas at a pressure higher than that during deposition of the crystallinity blocking tungsten film while setting a flow rate of the $WF_6$ gas to be higher than that during deposition of the crystallinity blocking tungsten film.

2. The tungsten film forming method of claim 1, wherein a time until deposition of the main tungsten film after completion of deposition of the crystallinity blocking tungsten film is set to 20 to 270 seconds.

3. The tungsten film forming method of claim 1, wherein the crystallinity blocking tungsten film has a thickness of 0.5 to 11.5 nm.

4. The tungsten film forming method of claim 1, wherein deposition of the crystallinity blocking tungsten film is performed while the pressure in the processing chamber is set to 100 to 26667 Pa, the flow rate of the $WF_6$ gas is set to 5 to 200 sccm (mL/min), and a flow rate of the $H_2$ gas is set to 100 to 12000 sccm (mL/min).

5. The tungsten film forming method of claim 1, wherein the adsorption of the gas is performed by supplying $SiH_4$ gas serving as a silicon compound gas and the $H_2$ gas.

6. The tungsten film forming method of claim 1, wherein adsorption of the gas is performed for 10 seconds or more.

7. The tungsten film forming method claim 1, wherein deposition of the main tungsten film is performed while the pressure in the processing chamber is set to 2666 to 26667 Pa, the flow rate of the $WF_6$ gas is set to 150 to 700 sccm (mL/min), and a flow rate of the $H_2$ gas is set to 1000 to 12000 sccm (mL/min).

8. The tungsten film forming method of claim 1, wherein the main tungsten film has a thickness of 25 nm or more.

9. The tungsten film forming method of claim 1, wherein after deposition of the main tungsten film, the substrate is annealed.

10. The tungsten film forming method of claim 9, wherein the annealing is performed at a temperature of 700° C. or more.

11. The tungsten film forming method of claim 9, wherein the main tungsten film has a thickness of 10 to 25 nm.

12. The tungsten film forming method of claim 1, wherein if the main tungsten film has a thickness of 10 to 25 nm, the crystallinity blocking tungsten film has a thickness of 3 nm or less.

13. The tungsten film forming method of claim 12, wherein the crystallinity blocking tungsten film has a thickness of 1.5 nm or less.

14. The tungsten film forming method of claim 1, wherein deposition of the initial tungsten film is performed for 4 to 20 seconds per cycle while the pressure in the processing chamber is set to 100 to 8000 Pa, the flow rate of the $WF_6$ gas is set to 50 to 500 sccm (mL/min), and a flow rate of the $H_2$ gas is set to 500 to 12000 sccm (mL/min), and the initial tungsten film has a thickness of 0.5 to 3.0 nm.

15. The tungsten film forming method of claim 1, wherein deposition of the initial tungsten film is performed by performing vacuum evacuation while stopping the supply of a purge gas during the purge.

16. The tungsten film forming method of claim 1, further comprising:

performing an initiation process to form nuclei on the surface of the substrate prior to deposition of the initial tungsten film.

17. The tungsten film forming method of claim 16, wherein the initiation process is performed by supplying $SiH_4$ gas.

18. The tungsten film forming method of claim 1, wherein a temperature of a mounting table for supporting the substrate is 350 to 500° C.

19. The tungsten film forming method of claim 1, wherein a TiN film is formed on the surface of the substrate.

20. A tungsten film forming method for forming a tungsten film on a surface of a substrate while heating the substrate in a depressurized atmosphere in a processing chamber, the method comprising:

forming an initial tungsten film for tungsten nucleation on the surface of the substrate by alternately repeating a supply of $WF_6$ gas which is raw material of tungsten and a supply of $H_2$ gas which is a reducing gas in the processing chamber while performing a purge in the processing chamber between the supplies of the $WF_6$ gas and the $H_2$ gas;

depositing a crystallinity blocking tungsten film for blocking crystallinity of the initial tungsten film by supplying the $WF_6$ gas and the $H_2$ gas into the processing chamber; and after stopping the supply of the $WF_6$ gas and increasing a pressure in the processing chamber after completion of deposition of the crystallinity blocking tungsten film, depositing a main tungsten film by supplying the $WF_6$ gas and the $H_2$ gas at a pressure higher than that during deposition of the crystallinity blocking tungsten film while setting a flow rate of the $WF_6$ gas to be higher than that during deposition of the crystallinity blocking tungsten film.

21. The tungsten film forming method of claim 20, wherein a time until deposition of the main tungsten film after completion of deposition of the crystallinity blocking tungsten film is set to 20 to 270 seconds.

22. The tungsten film forming method of claim 20, wherein the crystallinity blocking tungsten film has a thickness of 0.5 to 11.5 nm.

23. The tungsten film forming method of claim 20, wherein deposition of the crystallinity blocking tungsten film is performed while the pressure in the processing chamber is set to 100 to 26667 Pa, the flow rate of the $WF_6$ gas is set to 5 to 200 sccm (mL/min), and a flow rate of the $H_2$ gas is set to 100 to 12000 sccm (mL/min).

24. The tungsten film forming method claim 20, wherein deposition of the main tungsten film is performed while the pressure in the processing chamber is set to 2666 to 26667 Pa, the flow rate of the $WF_6$ gas is set to 150 to 700 sccm (mL/min), and a flow rate of the $H_2$ gas is set to 1000 to 12000 sccm (mL/min).

25. The tungsten film forming method of claim 20, wherein the main tungsten film has a thickness of 25 nm or more.

26. The tungsten film forming method of claim 20, wherein after deposition of the main tungsten film, the substrate is annealed.

27. The tungsten film forming method of claim 20, wherein if the main tungsten film has a thickness of 10 to 25 nm, the crystallinity blocking tungsten film has a thickness of 3 nm or less.

28. The tungsten film forming method of claim 20, wherein deposition of the initial tungsten film is performed for 4 to 20 seconds per cycle while the pressure in the processing chamber is set to 100 to 8000 Pa, the flow rate of the $WF_6$ gas is set to 50 to 500 sccm (mL/min), and a flow rate of the $H_2$ gas is set to 500 to 12000 sccm (mL/min), and the initial tungsten film has a thickness of 0.5 to 3.0 nm.

29. The tungsten film forming method of claim 20, wherein deposition of the initial tungsten film is performed by performing vacuum evacuation while stopping the supplies of a purge gas during the purge.

30. The tungsten film forming method of claim 20, further comprising:
performing an initiation process to form nuclei on the surface of the substrate prior to deposition of the initial tungsten film.

31. The tungsten film forming method of claim 20, wherein a temperature of a mounting table for supporting the substrate is 350 to 500° C.

32. The tungsten film forming method of claim 20, wherein a TiN film is formed on the surface of the substrate.

33. A tungsten film forming method for forming a tungsten film on a surface of a substrate while heating the substrate in a depressurized atmosphere in a processing chamber, the method comprising:
forming an initial tungsten film for tungsten nucleation on the surface of the substrate by alternately repeating a supply of $WF_6$ gas which is raw material of tungsten and a supply of $H_2$ gas which is a reducing gas in the processing chamber while performing a purge in the processing chamber between the supplies of the $WF_6$ gas and the $H_2$ gas;
adsorbing a gas containing a material for nucleation onto a surface of the initial tungsten film; and
depositing a main tungsten film onto the substrate on which the gas containing the material for nucleation is adsorbed by supplying the $WF_6$ gas and the $H_2$ gas in the processing chamber.

34. The tungsten film forming method of claim 33, wherein the adsorption of the gas is performed by supplying $SiH_4$ gas serving as a silicon compound gas and the $H_2$ gas.

35. The tungsten film forming method of claim 33, wherein adsorption of the gas is performed for 10 seconds or more.

36. The tungsten film forming method claim 33, wherein deposition of the main tungsten film is performed while the pressure in the processing chamber is set to 2666 to 26667 Pa, the flow rate of the $WF_6$ gas is set to 150 to 700 sccm (mL/min), and a flow rate of the $H_2$ gas is set to 1000 to 12000 sccm (mL/min).

37. The tungsten film forming method of claim 33, wherein the main tungsten film has a thickness of 25 nm or more.

38. The tungsten film forming method of claim 33, wherein after deposition of the main tungsten film, the substrate is annealed.

39. The tungsten film forming method of claim 33, wherein deposition of the initial tungsten film is performed for 4 to 20 seconds per cycle while the pressure in the processing chamber is set to 100 to 8000 Pa, the flow rate of the $WF_6$ gas is set to 50 to 500 sccm (mL/min), and a flow rate of the $H_2$ gas is set to 500 to 12000 sccm (mL/min), and the initial tungsten film has a thickness of 0.5 to 3.0 nm.

40. The tungsten film forming method of claim 33, wherein deposition of the initial tungsten film is performed by performing vacuum evacuation while stopping the supplies of a purge gas during the purge.

41. The tungsten film forming method of claim 33, further comprising:
performing an initiation process to form nuclei on the surface of the substrate prior to deposition of the initial tungsten film.

42. The tungsten film forming method of claim 33, wherein a temperature of a mounting table for supporting the substrate is 350 to 500° C.

43. The tungsten film forming method of claim 33, wherein a TiN film is formed on the surface of the substrate.

* * * * *